US008884332B2

(12) United States Patent
Umeda et al.

(10) Patent No.: US 8,884,332 B2
(45) Date of Patent: Nov. 11, 2014

(54) NITRIDE SEMICONDUCTOR DEVICE

(71) Applicant: Panasonic Corporation, Osaka (JP)

(72) Inventors: Hidekazu Umeda, Osaka (JP); Tetsuzo Ueda, Osaka (JP); Daisuke Ueda, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/975,085

(22) Filed: Aug. 23, 2013

(65) Prior Publication Data
US 2013/0341682 A1 Dec. 26, 2013

Related U.S. Application Data

(63) Continuation of application No. PCT/JP2011/004217, filed on Jul. 26, 2011.

(30) Foreign Application Priority Data

Feb. 23, 2011 (JP) .................................. 2011-037326

(51) Int. Cl.
| | | |
|---|---|---|
| H01L 29/732 | (2006.01) | |
| H01L 31/109 | (2006.01) | |
| H01L 21/00 | (2006.01) | |
| H01L 29/417 | (2006.01) | |
| H01L 29/06 | (2006.01) | |
| H01L 29/778 | (2006.01) | |
| H01L 29/861 | (2006.01) | |
| H01L 29/20 | (2006.01) | |

(52) U.S. Cl.
CPC ...... *H01L 29/0607* (2013.01); *H01L 29/41725* (2013.01); *H01L 29/7786* (2013.01); *H01L 29/2003* (2013.01); *H01L 29/0692* (2013.01); *H01L 29/861* (2013.01)
USPC ........... 257/183; 257/189; 257/200; 257/491; 438/47; 438/94; 438/172

(58) Field of Classification Search
CPC ............ H01L 29/0607; H01L 29/2003; H01L 29/7371; H01L 29/66462; H01L 29/66318; H01L 29/66242; H01L 29/802

USPC ......... 257/183, 187, 189, 192, 194, 200, 201, 257/409, 487, 491; 438/47, 94, 172, 191
See application file for complete search history.

(56) References Cited

U.S. PATENT DOCUMENTS

| 6,015,979 A | 1/2000 | Sugiura et al. |
|---|---|---|
| 2004/0099888 A1 | 5/2004 | Sriram |

(Continued)

FOREIGN PATENT DOCUMENTS

| JP | 2000-021789 A | 1/2000 |
|---|---|---|
| JP | 2004-327891 A | 11/2004 |

(Continued)

OTHER PUBLICATIONS

International Search Report issued in PCT/JP2011/004217 with Date of Mailing Oct. 11, 2011.

*Primary Examiner* — Hsien Ming Lee
(74) *Attorney, Agent, or Firm* — McDermott Will & Emery LLP

(57) ABSTRACT

A nitride semiconductor device includes a semiconductor substrate and a nitride semiconductor layer disposed on the semiconductor substrate. The semiconductor substrate includes a normal region, a carrier supplying region, and an interface current blocking region. The interface current blocking region surrounds the normal region and the carrier supplying region. The interface current blocking region and the carrier supplying region include impurities. The carrier supplying region has a conductivity type allowing the carrier supplying region to serve as a source of carriers supplied to or a destination of carriers supplied from a carrier layer generated at an interface between the nitride semiconductor layer and the semiconductor substrate. The interface current blocking region has a conductivity type allowing the interface current blocking region to serve as a potential barrier to the carriers.

20 Claims, 19 Drawing Sheets

(56) References Cited

U.S. PATENT DOCUMENTS

| | | |
|---|---|---|
| 2006/0124960 A1 | 6/2006 | Hirose et al. |
| 2006/0170003 A1 | 8/2006 | Saito et al. |
| 2006/0261356 A1 | 11/2006 | Iwakami et al. |
| 2008/0315257 A1 | 12/2008 | Shiraishi |
| 2012/0153355 A1* | 6/2012 | Umeda et al. ............ 257/192 |

FOREIGN PATENT DOCUMENTS

| | | | |
|---|---|---|---|
| JP | 2004-342810 A | 12/2004 | |
| JP | 2005-217049 A | 8/2005 | |
| JP | 2006-507683 A | 3/2006 | |
| JP | 2006-196869 A | 7/2006 | |
| JP | 2006-216671 A | 8/2006 | |
| JP | 2007-180330 A | 7/2007 | |
| JP | 2008-177515 A | 7/2008 | |
| JP | 2009-004398 A | 1/2009 | |
| JP | 2010-087374 A | 4/2010 | |
| JP | WO 2011/024367 * | 3/2011 | ............ H01L 29/06 |
| WO | 2010/038150 A1 | 4/2010 | |

* cited by examiner

NITRIDE SEMICONDUCTOR DEVICE

CROSS-REFERENCE TO RELATED APPLICATIONS

This is a continuation of International Application No. PCT/JP2011/004217 filed on Jul. 26, 2011, which claims priority to Japanese Patent Application No. 2011-037326 filed on Feb. 23, 2011. The entire disclosures of these applications are incorporated by reference herein.

BACKGROUND

The present disclosure relates to nitride semiconductor devices, and more particularly to a semiconductor device using a nitride semiconductor that is applicable as a power transistor etc. particularly used for a power supply circuit.

A nitride semiconductor typified by gallium nitride (GaN) attracts attention as a material for a high-frequency semiconductor device or a high-power semiconductor device. A silicon (Si) substrate etc. is under study as a substrate on which a semiconductor device using a nitride semiconductor is disposed. A Si substrate is easy to increase in diameter, and thus a Si substrate on which a nitride semiconductor is grown can dramatically decrease the cost of a semiconductor device using a nitride semiconductor.

The potential of a Si substrate on which a semiconductor device using a nitride semiconductor is disposed affects the device operation. To stabilize the potential of the Si substrate, a back electrode is disposed on the back of the Si substrate, and connected with a source electrode or a drain electrode. When the back electrode is electrically connected with the source electrode or the drain electrode, a high voltage is applied between the back electrode and the source electrode or the drain electrode. Thus, there is a need for an increase in a vertical breakdown voltage of the semiconductor device. The vertical breakdown voltage of the semiconductor device disposed on the Si substrate depends on the breakdown voltage of the nitride semiconductor layer grown on the Si substrate and the breakdown voltage of the Si substrate. To increase the breakdown voltage of the nitride semiconductor layer, the thickness of the nitride semiconductor layer needs to be increased. However, Si and a nitride semiconductor considerably differ from each other in the lattice constant and the coefficient of thermal expansion, and thus the thickness of the nitride semiconductor disposed on the Si substrate is limited.

Thus, a Si substrate having a high breakdown voltage is under study to increase the vertical breakdown voltage of a semiconductor device (see, e.g., Japanese Patent Publication No. 2005-217049).

SUMMARY

However, the inventors of the present application found that an increase in the breakdown voltage of a Si substrate hardly affects the vertical breakdown voltage of a semiconductor device. The inventors also found that a similar problem occurs in not only a Si substrate but also different semiconductor substrates such as a silicon carbide (SiC) substrate, a gallium arsenide (GaAs) substrate, etc. Moreover, the inventors found that the factor that prevents an increase in the vertical breakdown voltage of the semiconductor device also affects the electrical characteristics of the semiconductor device such as the switching characteristics, the high-frequency characteristics, etc.

It is an aspect of the present disclosure to provide, based on the findings of the inventors of the present application, on a semiconductor substrate, a nitride semiconductor device with an increased vertical breakdown voltage and improved electrical characteristics.

To solve the problem, a nitride semiconductor device of the present disclosure includes a carrier supplying region provided on a semiconductor substrate. The carrier supplying region has a conductivity type allowing the carrier supplying region to serve as a source or a destination of carries depending on an electric field.

Specifically, the nitride semiconductor device includes a semiconductor substrate and a nitride semiconductor layer disposed on the semiconductor substrate. The semiconductor substrate includes a normal region, a carrier supplying region, and an interface current blocking region. The nitride semiconductor layer includes a device region and a device isolation region surrounding the device region. The interface current blocking region surrounds the normal region and the carrier supplying region. The interface current blocking region and the carrier supplying region include impurities. At least a part of the device region is disposed above the normal region. The carrier supplying region has a conductivity type allowing the carrier supplying region to serve as a source of carriers supplied to or a destination of carriers supplied from a carrier layer generated at an interface between the nitride semiconductor layer and the semiconductor substrate depending on an electric field applied therebetween. The interface current blocking region has a conductivity type allowing the interface current blocking region to serve as a potential barrier to the carriers.

The nitride semiconductor device includes the carrier supplying region provided on the semiconductor substrate. The carrier supplying region has a conductivity type allowing the carrier supplying region to serve as a source of carriers supplied to or a destination of carriers supplied from the carrier layer generated depending on an electric field applied between the nitride semiconductor layer and the semiconductor substrate. Thus, the carrier layer appears or disappears quickly in transition between an on state and an off state of the semiconductor device. Consequently, the switching characteristics, the high-frequency characteristics, etc. of the nitride semiconductor device can be improved. In addition, the nitride semiconductor device includes the interface current blocking region that has a conductivity type allowing the interface current blocking region to serve as a potential barrier to carriers generated at the interface. Consequently, a current path is less likely to occur at the interface. Therefore, the vertical breakdown voltage of the nitride semiconductor device can be improved.

In the nitride semiconductor device, the carrier supplying region may have the same conductivity type as the normal region does, and the carrier supplying region may have a higher impurity concentration than the normal region does. In addition, the carrier supplying region and the normal region may have different conductivity types.

Moreover, the carrier supplying region may include a first carrier supplier having the same conductivity type as the normal region does, and a second carrier supplier having a conductivity type different from a conductivity type of the normal region. The first carrier supplier may have a higher impurity concentration than the normal region does. In this case, the first carrier supplier and the second carrier supplier are preferably separated from each other.

In the nitride semiconductor device, the carrier supplying region has an impurity concentration that is preferably more than or equal to $1 \times 10^{16}$ cm$^{-3}$.

In the nitride semiconductor device, the carrier supplying region is preferably disposed in a portion, of the semiconductor substrate, other than a portion directly under the device region.

In the nitride semiconductor device, the interface current blocking region may have the same conductivity type as the normal region does, and the interface current blocking region may have a higher impurity concentration than the normal region does. In addition, the interface current blocking region and the normal region may have different conductivity types.

Moreover, the interface current blocking region may include a first interface current blocking portion having the same conductivity type as the normal region does, and a second interface current blocking portion having a conductivity type different from a conductivity type of the normal region. The first interface current blocking portion may have a higher impurity concentration than the normal region does. In this case, the first interface current blocking portion and the second interface current blocking portion are preferably separated from each other.

In the nitride semiconductor device, the interface current blocking region has an impurity concentration that is preferably more than or equal to $1 \times 10^{16}$ cm$^{-3}$.

In the nitride semiconductor device, the interface current blocking region is preferably disposed in a portion, of the semiconductor substrate, other than a portion directly under the device region.

In the nitride semiconductor device, the nitride semiconductor layer may include a first layer and a second layer disposed on the first layer and having a wider band gap than the first layer does.

The nitride semiconductor device may further include a source electrode, a drain electrode, and a gate electrode that are disposed on the nitride semiconductor layer. The nitride semiconductor device may further include a cathode electrode and an anode electrode that are disposed on the nitride semiconductor layer.

The nitride semiconductor device may further include a back electrode disposed on a surface, of the semiconductor substrate, opposite to a surface on which the nitride semiconductor layer is disposed; and a through electrode penetrating the nitride semiconductor layer and the semiconductor substrate, and connected with the back electrode.

In the nitride semiconductor device, the through electrode is preferably surrounded by the interface current blocking region in a top surface of the semiconductor substrate.

In the nitride semiconductor device, the through electrode preferably penetrates the interface current blocking region.

The device region of the nitride semiconductor device is preferably misaligned with the carrier supplying region in plan view.

The semiconductor device of the present disclosure using the semiconductor substrate can improve the vertical breakdown voltage of the nitride semiconductor device, and can obtain the excellent switching or high-frequency characteristics.

BRIEF DESCRIPTION OF THE DRAWINGS

FIG. 1A is a plan view of the semiconductor device. FIG. 1B is a cross-sectional view of the semiconductor device taken along line Ib-Ib of FIG. 1A. FIG. 1C is a plan view of the semiconductor device. FIG. 1D is a cross-sectional view of the semiconductor device taken along line Id-Id of FIG. 1C.

FIG. 2A is a plan view of the semiconductor device. FIG. 2B is a cross-sectional view of the semiconductor device taken along line IIb-IIb of FIG. 2A.

FIG. 3A is a plan view of the semiconductor device. FIG. 3B is a cross-sectional view of the semiconductor device taken along line IIIb-IIIb of FIG. 3A.

FIG. 4A is a plan view of the semiconductor device. FIG. 4B is a cross-sectional view of the semiconductor device taken along line IVb-IVb of FIG. 4A.

FIG. 5A is a plan view of the semiconductor device. FIG. 5B is a cross-sectional view of the semiconductor device taken along line Vb-Vb of FIG. 5A.

FIG. 6A is a plan view of the semiconductor device. FIG. 6B is a cross-sectional view of the semiconductor device taken along line VIb-VIb of FIG. 6A.

FIG. 7A is a plan view of the semiconductor device. FIG. 7B is a cross-sectional view of the semiconductor device taken along line VIIb-VIIb of FIG. 7A.

FIG. 8A is a plan view of the semiconductor device. FIG. 8B is a cross-sectional view of the semiconductor device taken along line VIIIb-VIIIb of FIG. 8A.

FIG. 9A is a plan view of the semiconductor device. FIG. 9B is a cross-sectional view of the semiconductor device taken along line IXb-IXb of FIG. 9A.

FIG. 10A is a plan view of the semiconductor device. FIG. 10B is a cross-sectional view of the semiconductor device taken along line Xb-Xb of FIG. 10A.

FIG. 11A is a plan view of the semiconductor device. FIG. 11B is a cross-sectional view of the semiconductor device taken along line XIb-XIb of FIG. 11A.

FIG. 12A is a plan view of the semiconductor device. FIG. 12B is a cross-sectional view of the semiconductor device taken along line XIIb-XIIb of FIG. 12A.

FIG. 13A is a plan view of the semiconductor device. FIG. 13B is a cross-sectional view of the semiconductor device taken along line XIIIb-XIIIb of FIG. 13A. FIG. 13C is a plan view of the semiconductor device. FIG. 13D is a cross-sectional view of the semiconductor device taken along line XIIId-XIIId of FIG. 13C.

FIG. 14A is a plan view of the semiconductor device. FIG. 14B is a cross-sectional view of the semiconductor device taken along line XIVb-XIVb of FIG. 14A.

DETAILED DESCRIPTION

Figure 1A:
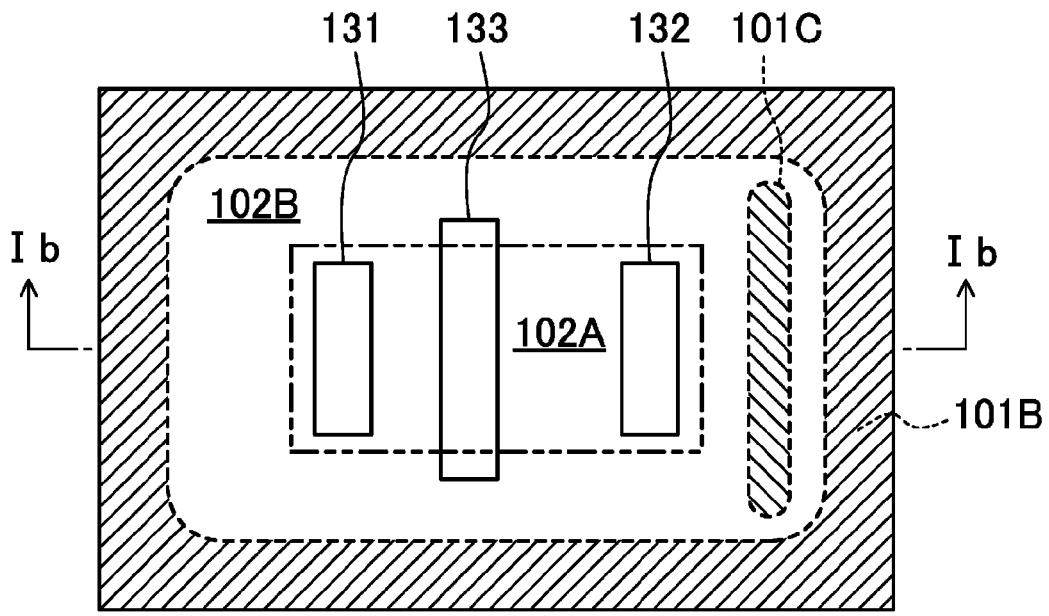
FIGS. 1A and 1B illustrate a semiconductor device of one embodiment.

In this specification, AlGaN represents a ternary compound $Al_xGa_{1-x}N$ (where $0 \leq x \leq 1$). Multinary compounds are abbreviated as the sequence of their chemical symbols, such as AlInN, GaInN, etc. For example, a nitride semiconductor $Al_xGa_{1-x-y}In_yN$ (where $0 \leq x \leq 1$, $0 \leq y \leq 1$, and $x+y \leq 1$) is abbreviated as AlGaInN. In addition, the term "undoped" means that impurities are not intentionally introduced.

First, the relation, found by the inventors of the present application, between a breakdown voltage of a semiconductor substrate and a vertical breakdown voltage of a semiconductor device will be described.

In the beginning, a nitride semiconductor layer having a predetermined thickness was formed as an evaluation semiconductor device on various p-type Si substrates and n-type Si substrates having different carrier (impurity) concentrations. Then, a vertical breakdown voltage of the evaluation semiconductor device was measured. It is predicted that the vertical breakdown voltage of the evaluation semiconductor device is the sum of the vertical breakdown voltages of the Si substrate and the nitride semiconductor layer. It is known that the breakdown voltage of Si varies widely with the concentration of carriers in Si. In general, with a lower carrier concentration, the width of a depletion layer in Si increases. Thus, there is a tendency for the breakdown voltage of Si to be higher with a lower carrier concentration. Thus, it is expected that the evaluation semiconductor device disposed on the Si substrate having a low carrier concentration has a high vertical breakdown voltage. However, the value of the vertical breakdown voltage, obtained by the measurement, of the evaluation semiconductor device did not depend on the carrier concentration of the Si substrate, and remained almost constant. This indicates that the vertical breakdown voltage of the Si substrate hardly contributes to that of the evaluation semiconductor device.

Moreover, the inventors of the present application measured the capacitance of the evaluation semiconductor device. From this measurement, the inventors found that the application of a positive voltage, with reference to the p-type Si substrate, to the nitride semiconductor layer disposed on the p-type Si substrate inverts the polarity of Si, from positive to negative, located near the interface between the p-type Si substrate and the nitride semiconductor layer, and forms an electron inversion layer having a high electron concentration. Furthermore, the inventors found that the application of a negative voltage, with reference to the p-type Si substrate, to the nitride semiconductor layer forms a hole accumulation layer at the interface between the p-type Si substrate and the nitride semiconductor layer.

Similarly, the application of a negative voltage, with reference to the n-type Si substrate, to the nitride semiconductor layer disposed on the n-type Si substrate inverts the polarity of a semiconductor layer, from negative to positive, located near the interface between the n-type Si substrate and the nitride semiconductor, and forms a hole inversion layer having a high hole concentration. In addition, the inventors found that the application of a positive voltage, with reference to the n-type Si substrate, to the nitride semiconductor layer forms an electron accumulation layer at the interface between the n-type Si substrate and the nitride semiconductor layer.

The carrier layer, disposed at the interface between the nitride semiconductor layer and the Si substrate, such as the electron inversion layer, the electron accumulation layer, the hole inversion layer, and the hole accumulation layer, serves as a current path reaching a side surface of the Si substrate. Therefore, when a vertical voltage is applied to the nitride semiconductor layer, a current flows not in the Si substrate but in the current path disposed at the interface between the nitride semiconductor layer and the Si substrate, and also flows on the side surface of Si substrate. That is, the vertical breakdown voltage of the Si substrate hardly contributes to that of the semiconductor device.

In addition, the delay, occurring depending on the application of electric fields, in generation and disappearance of the carrier layer degraded the switching characteristics and the high-frequency characteristics of the semiconductor device.

It is conceivable that the detection of a carrier layer disposed at the interface between a nitride semiconductor and a Si substrate has been achieved by the improved technique of a crystal growth process for forming a nitride semiconductor layer on a Si substrate. The improved crystal growth technique has made it possible to grow, on a Si substrate, a nitride semiconductor having a high crystallinity. It is conceivable that the carrier layer is generated because the composition at the interface between the Si substrate and the nitride semiconductor layer switches in a narrow range, and the so-called steepness of interface is improved.

As described above, the vertical breakdown voltage can be improved by reducing the effect of the current path occurring at the interface between the nitride semiconductor layer and the Si substrate. In addition, the switching characteristics and the high-frequency characteristics can be improved by increasing the generation speed and the disappearance speed of the carrier layer at the interface between the nitride semiconductor layer and the Si substrate.

A semiconductor device having an improved vertical breakdown voltage, switching characteristics, and high-frequency characteristics will be described in detail below.

Figure 1B:
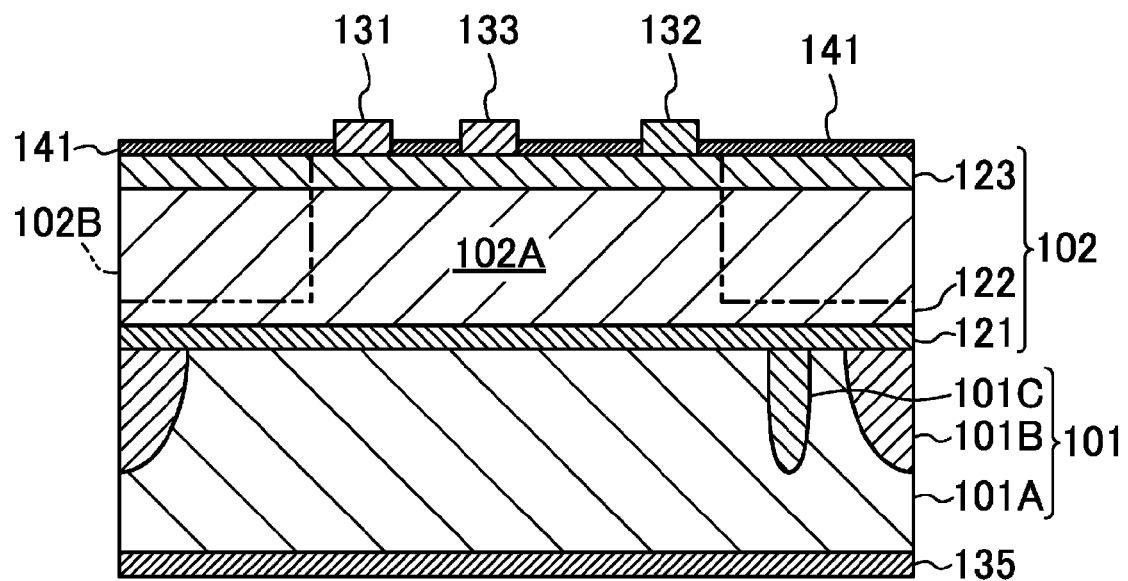

FIGS. 1A and 1B illustrate a semiconductor device of one embodiment. FIG. 1A illustrates a planar configuration. FIG. 1B illustrates a cross-sectional configuration taken along line Ib-Ib of FIG. 1A. As illustrated in FIGS. 1A and 1B, the semiconductor device of this embodiment is a heterojunction field effect transistor (HFET), and includes a semiconductor substrate 101 and a nitride semiconductor layer 102 disposed on the semiconductor substrate 101. In this embodiment, the semiconductor substrate 101 is a p-type Si substrate of which a principal surface is a (111) plane. The nitride semiconductor layer 102 includes a buffer layer 121, a channel layer 122, and a cap layer 123, which are disposed in this order on the principal surface of the semiconductor substrate 101. The buffer layer 121 is made of, for example, AlN, which is a nitride semiconductor. The channel layer 122 is made of, for example, undoped GaN that is 1 μm in thickness. The cap layer 123 is made of, for example, undoped AlGaN that is 25 nm in thickness. The composition ratio of Al in the cap layer 123 might be approximately 25%.

The nitride semiconductor layer 102 includes a device region 102A and a device isolation region 102B surrounding the device region 102A. The device isolation region 102B reaches a lower level than the interface between the cap layer 123 and the channel layer 122 does. The device isolation region 102B is a region having higher resistance than the device region 102A does. The device isolation region 102B might be formed by, for example, ion implantation of non-conductive impurities such as argon.

A source electrode 131, a drain electrode 132, and a gate electrode 133 are disposed above the device region 102A. The source electrode 131 and the drain electrode 132 form an ohmic junction with a two-dimensional electron gas layer disposed at the interface between the cap layer 123 and the channel layer 122. The source electrode 131 and the drain electrode 132 might be, for example, a stacked film made of titanium and aluminum. The gate electrode 133 forms a Schottky junction with the cap layer 123. The gate electrode 133 might be, for example, a stacked film made of nickel and gold. The gate electrode 133 is disposed across the device region 102A, and disposed over the device isolation region 102B. Note that this configuration of the gate electrode 133 may also apply to the source electrode 131 and the drain electrode 132.

A passivation film 141 that is 200 nm in thickness and is made of silicon nitride (SiN) covers a surface of the nitride semiconductor layer 102. A back electrode 135 made of, for example, aluminum is disposed on a surface (a back surface), of the semiconductor substrate 101, opposite to the surface on which the nitride semiconductor layer 102 is disposed. The back electrode 135 is connected with the source electrode 131 through wiring (not shown) etc.

The semiconductor substrate 101 includes a normal region 101A, an interface current blocking region 101B, and a carrier supplying region 101C. The interface current blocking region 101B and the carrier supplying region have higher impurity concentrations than the normal region 101A does. The interface current blocking region includes p-type impurities. The carrier supplying region 101C includes n-type impurities. The normal region 101A and the carrier supplying region 101C are surrounded by the interface current blocking region 101B. The carrier supplying region 101C and the interface current blocking region 101B are separated from each other. Both the carrier supplying region and the interface current blocking region have high impurity concentrations, and thus are preferably separated from each other. However, the carrier supplying region 101C and the interface current blocking region 101B may come into contact with each other. In FIGS. 1A and 1B, the normal region 101A, the interface current blocking region 101B, and the carrier supplying region 101C are in contact with the buffer layer 121. The carrier supplying region 101C is disposed at a laterally outer side of the drain electrode 132. The term "laterally" means in the lateral direction in the drawings. The device isolation region 102B is disposed directly above the carrier supplying region 101C. The interface current blocking region 101B is exposed from a side surface of the semiconductor substrate 101.

Next, the operation of the semiconductor device of this embodiment will be described. Suppose that a positive voltage is applied to the drain electrode 132 with reference to the potential of the source electrode 131 in a state in which the source electrode 131 and the back electrode 135 are connected with each other. In this case, when a negative voltage is applied to the gate electrode 133, the HFET is turned off, and an electric field is generated from the drain electrode 132 to the semiconductor substrate 101. Consequently, an electron inversion layer is formed at the interface between the p-type semiconductor substrate 101 and the buffer layer 121. In contrast, when a positive voltage is applied to the gate, the HFET is turned on, and the electric field generated from the drain electrode 132 to the semiconductor substrate 101 becomes almost zero. Then, the electron inversion layer formed between the p-type semiconductor substrate 101 and the buffer layer 121 disappears. To improve the switching characteristics and the high-frequency characteristics of the HFET, the electron inversion layer preferably appears or disappears quickly in transition between an on state and an off state of the HFET.

The semiconductor device of this embodiment includes the carrier supplying region 101C having a high concentration of n-type impurities. Thus, when a negative voltage is applied to the gate electrode 133, electrons forming an electron inversion layer are supplied from the carrier supplying region 101C. In contrast, when a positive voltage is applied to the gate electrode 133, the electrons forming an electron inversion layer is emitted to the carrier supplying region 101C. As a result, the electron inversion layer appears or disappears quickly, and the switching characteristics and the high-frequency characteristics of the HFET are improved.

The carrier supplying region 101C needs to be a source or a destination, of electrons serving as carriers, disposed at the interface between the nitride semiconductor layer 102 and the semiconductor substrate 101 in transition between an on state and an off state of the HFET. If the semiconductor substrate 101 is a p-type substrate, the carrier supplying region 101C includes n-type impurities of which concentration is higher than that of the p-type impurities in the normal region 101A. Specifically, the concentration of the n-type impurities needs to be more than or equal to $1 \times 10^{16}$ cm$^3$. The concentration of the n-type impurities is preferably as high as possible. However, an excessively high concentration of the n-type impurities causes difficulty in ion implantation etc., and affects the crystallinity etc. of the substrate. Thus, the concentration of the n-type impurities is preferably less than or equal to approximately $1 \times 10^{21}$ cm$^3$. Note that if the semiconductor substrate 101 is an n-type substrate, the carrier supplying region also needs to include n-type impurities. Thus, the concentration of the n-type impurities needs to be higher than that of n-type impurities in the normal region 101A.

The semiconductor device of this embodiment includes the interface current blocking region 101B having a high concentration of p-type impurities. The interface current blocking region 101B serves as a potential barrier to electrons. Thus, if the electron inversion layer is disposed at the interface between the buffer layer 121 and the semiconductor substrate 101, occurrence of a current path is prevented at the interface, and a current cannot reach the side surface of the semiconductor substrate 101. As a result, a leakage current vertically flows through the semiconductor substrate 101. Thus, the vertical breakdown voltage of the semiconductor substrate 101 contributes to and significantly improves the vertical breakdown voltage of the semiconductor device.

The vertical breakdown voltage of the semiconductor device of this embodiment depends on the vertical breakdown voltages of the nitride semiconductor layer 102 and semiconductor substrate 101. If the nitride semiconductor layer 102 has an even thickness, the vertical breakdown voltage of the semiconductor device becomes larger as that of semiconductor substrate 101 becomes larger. The vertical breakdown voltage of the semiconductor substrate 101 depends on the thickness of the semiconductor substrate 101 and the impurity concentration of the semiconductor substrate 101. The vertical breakdown voltage of the semiconductor substrate 101 becomes higher as the impurity concentration of the semiconductor substrate 101 becomes lower. Thus, the impurity concentration of the semiconductor substrate 101 is preferably as low as possible. If the semiconductor substrate 101 is a Si substrate, the impurity concentration of the normal region 101A is preferably approximately from $1\times10^{12}$ cm$^{-3}$ to $1\times10^{16}$ cm$^{-3}$.

The interface current blocking region 101B of the semiconductor device of this embodiment needs to be a potential barrier to electrons. Thus, if the semiconductor substrate 101 is a p-type substrate, the interface current blocking region 101B needs to have a higher concentration of p-type impurities than the normal region 101A does. If the normal region 101A has the concentration of p-type impurities that is approximately from $1\times10^{12}$ cm$^{-3}$ to $1\times10^{16}$ cm$^{-3}$, the concentration of p-type impurities in the interface current blocking region 101B needs to be more than or equal to approximately $1\times10^{16}$ cm$^{-3}$. Moreover, to serve as a potential barrier more efficiently, the interface current blocking region 101B preferably has the concentration of p-type impurities that is more than or equal to approximately $1\times10^{18}$ cm$^{-3}$, and more preferably more than or equal to approximately $1\times10^{19}$ cm$^{-3}$. The concentration of the p-type impurities is preferably as high as possible. However, an excessively high concentration of the p-type impurities causes difficulty in ion implantation etc., and affects the crystallinity etc. of the substrate. Thus, the concentration of the p-type impurities is preferably less than or equal to approximately $1\times10^{21}$ cm$^{-3}$.

In FIGS. 1A and 1B, the device region 102A is disposed directly above the normal region 101A, and the device isolation region 102B is disposed directly above the carrier supplying region 101C. Thus, in plan view, the device region 102A is misaligned with the carrier supplying region 101C. It is conceivable that the carrier supplying region 101C has a low tolerance for a vertical electric field because the carrier supplying region 101C has a high impurity concentration. Thus, a channel is preferably not disposed directly above the carrier supplying region 101C. Therefore, in the device region 102A, at least a portion between the source electrode 131 and the drain electrode 132 is preferably disposed directly above the normal region 101A. However, a part of the device region 102A may be disposed directly above the carrier supplying region 101C. In particular, if the carrier supplying region 101C has a low impurity concentration, a channel might be disposed directly above the carrier supplying region 101C. Note that a region directly above the normal region 101A is within or coincides with a region that overlaps the normal region 101A in plan view. A region directly above the carrier supplying region 101C is within or coincides with a region that overlaps the carrier supplying region 101C in plan view.

Figure 1C:
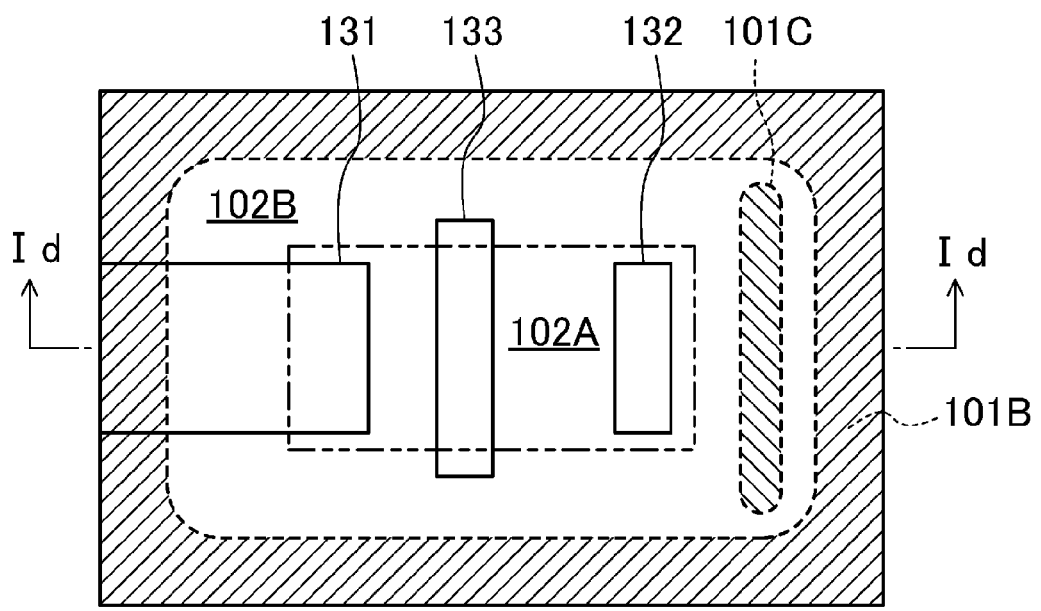
FIGS. 1C and 1D illustrate a semiconductor device of one embodiment.
Figure 1D:
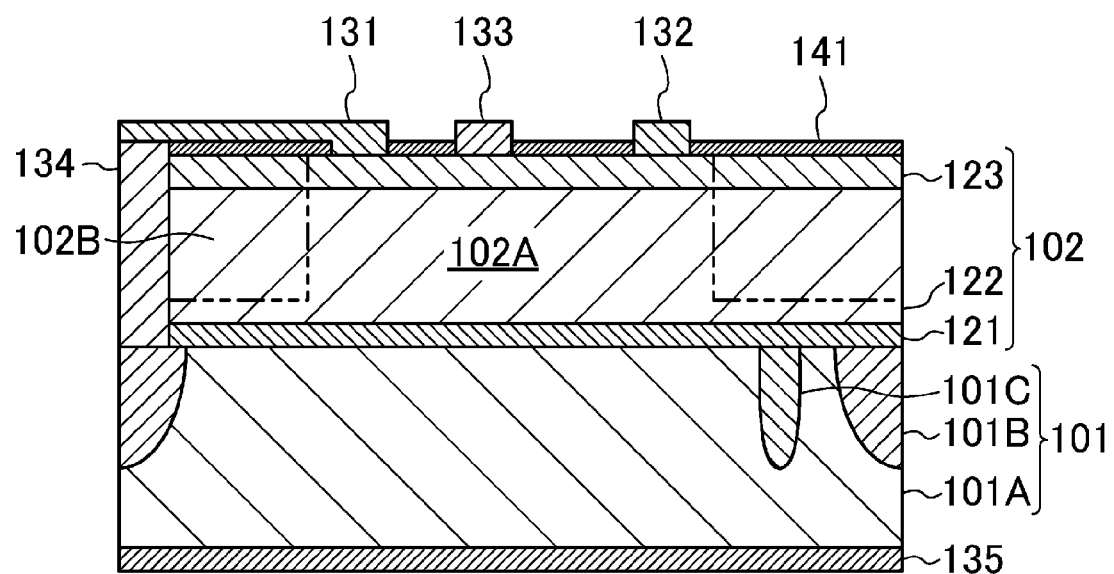
Figure 2A:
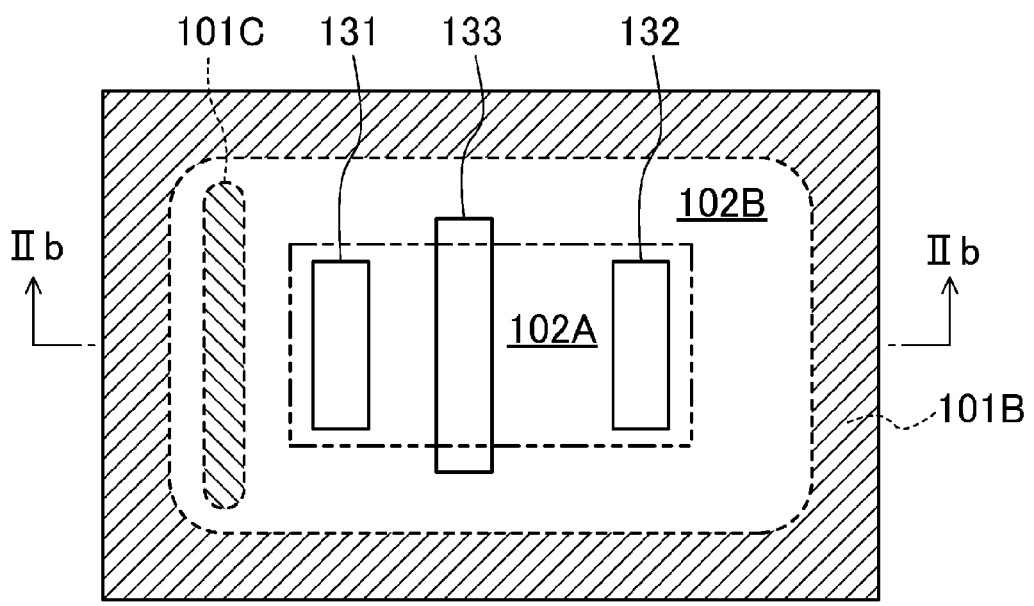
FIGS. 2A and 2B illustrate an alternative example of the semiconductor device of the one embodiment.
Figure 2B:
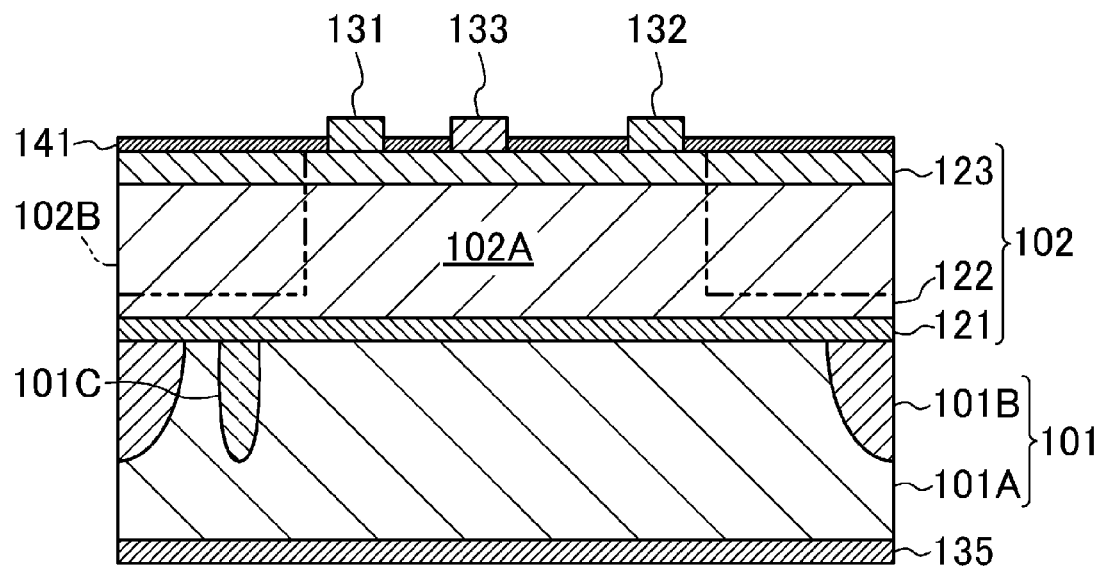
Figure 3A:
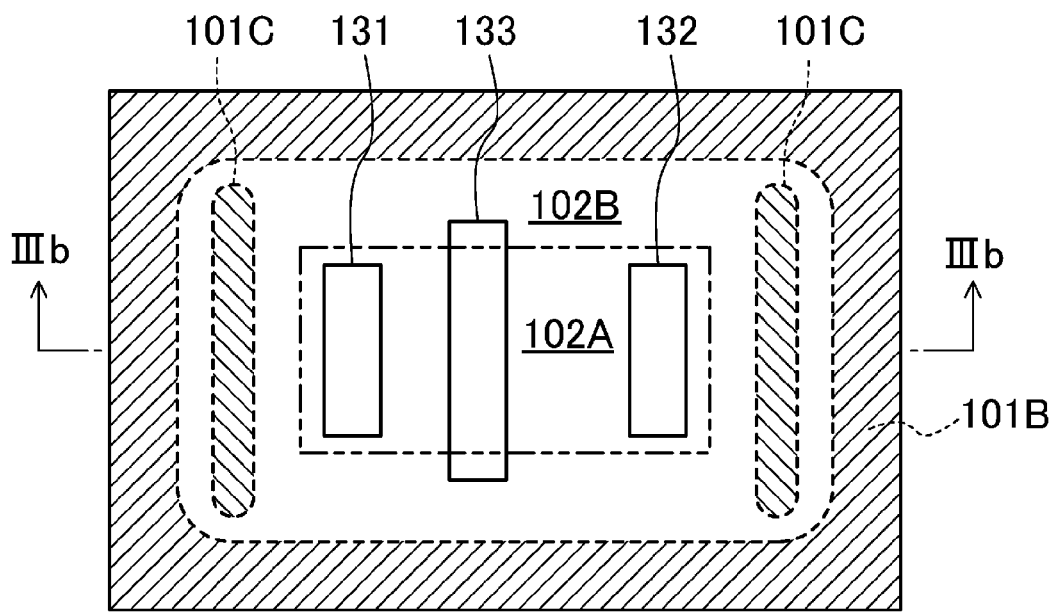
FIGS. 3A and 3B illustrate an alternative example of the semiconductor device of the one embodiment.
Figure 3B:
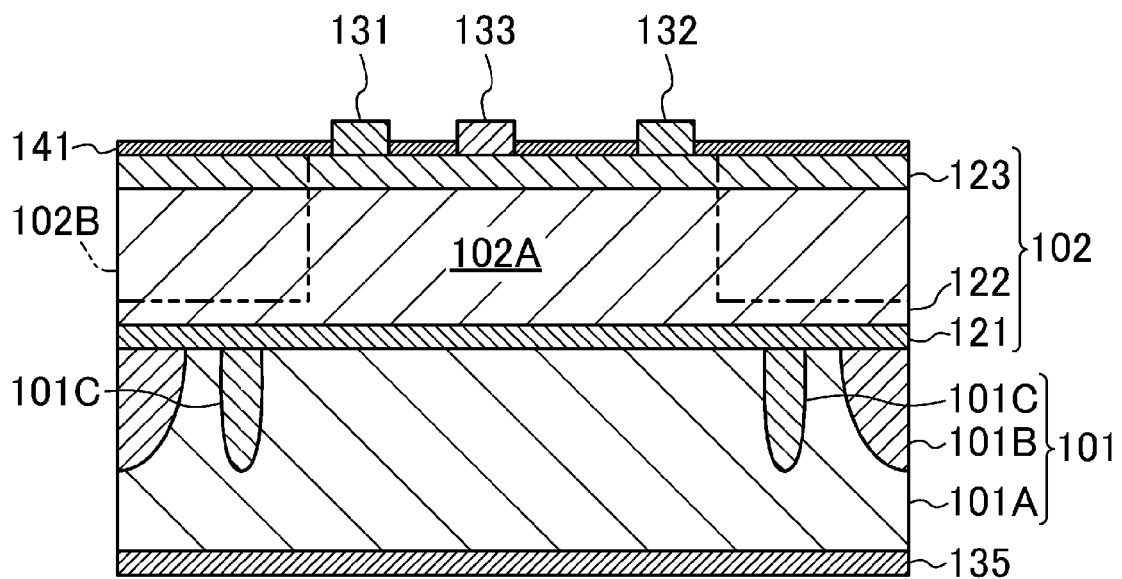
Figure 4A:
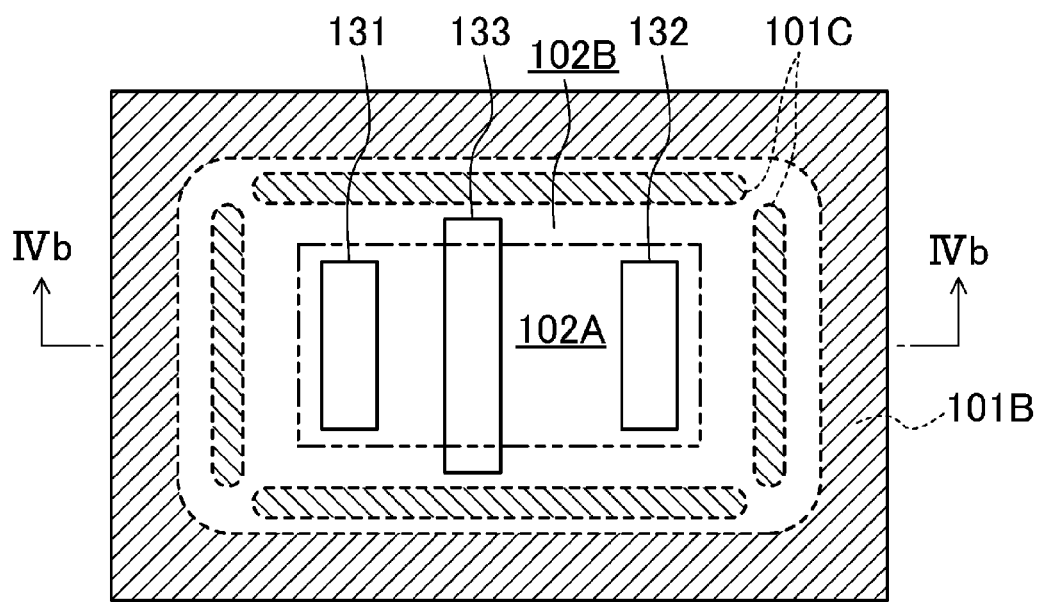
FIGS. 4A and 4B illustrate an alternative example of the semiconductor device of the one embodiment.
Figure 4B:
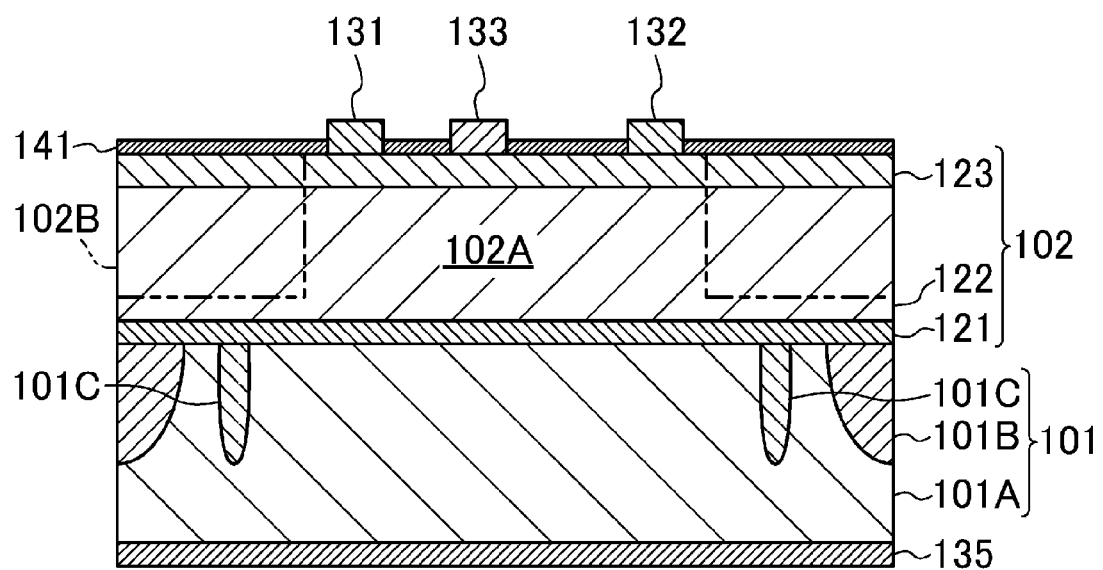
Figure 5A:
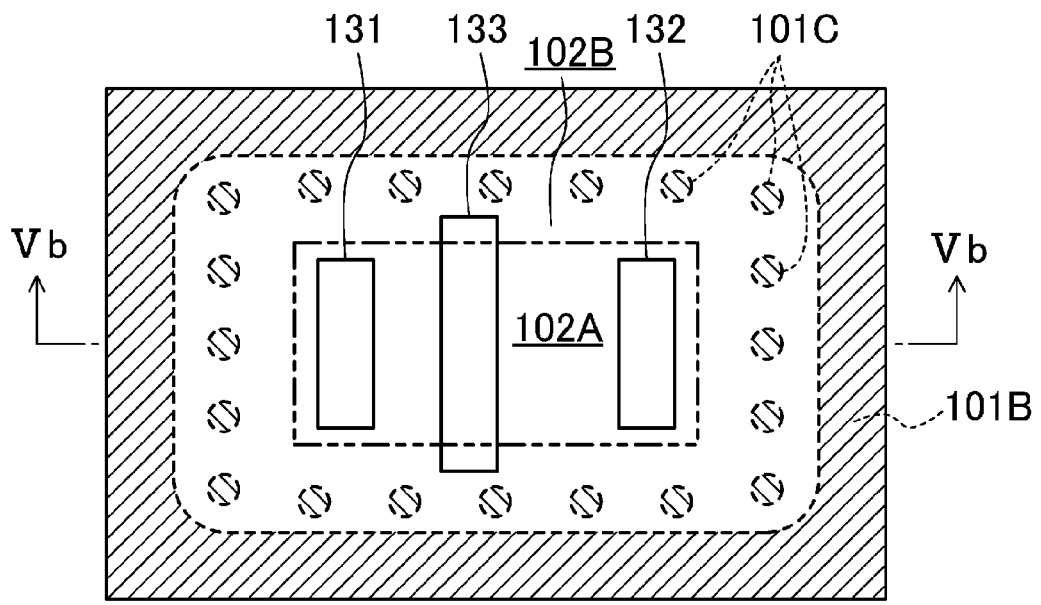
FIGS. 5A and 5B illustrate an alternative example of the semiconductor device of the one embodiment.
Figure 5B:
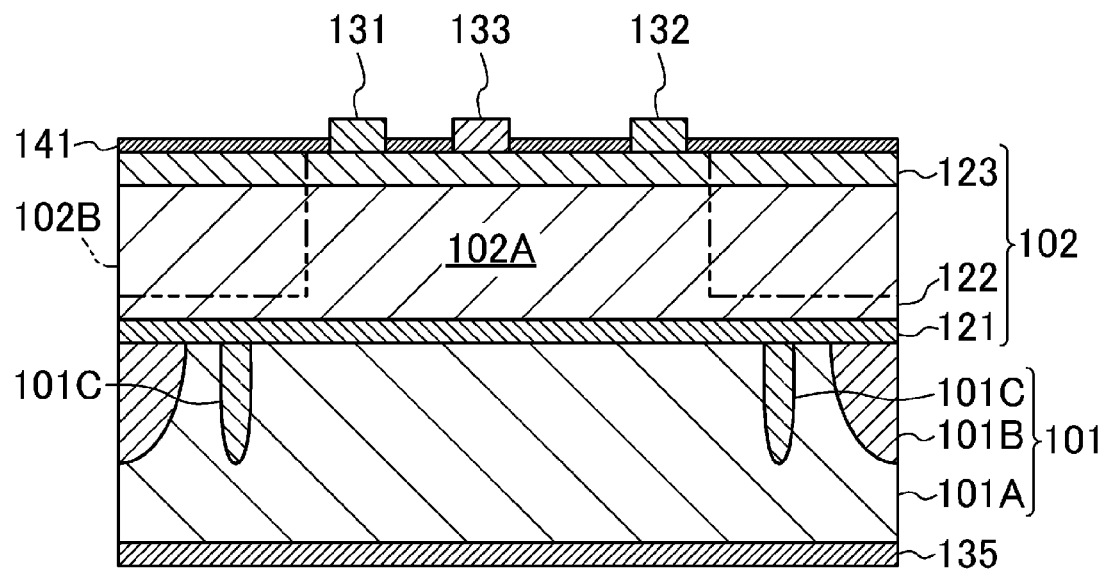

In addition, in FIGS. 1A and 1B, the carrier supplying region 101C is disposed at the laterally outer side of the drain electrode 132. Alternatively, as illustrated in FIGS. 2A and 2B, the carrier supplying region 101C may be disposed at a laterally outer side of the source electrode 131. Furthermore, as illustrated in FIGS. 3A and 3B, the carrier supplying region 101C may be disposed at each of the laterally outer sides of the source electrode 131 and the drain electrode 132. FIGS. 1A-3B illustrate the examples where the carrier supplying region 101C is disposed along the source electrode 131 or the drain electrode 132. Alternatively, as illustrated in FIGS. 4A and 4B, the carrier supplying regions 101C may be disposed across the source electrode 131 and the drain electrode 132. FIGS. 4A and 4B illustrate an example where four independent carrier supplying regions 101C are disposed. Alternatively, all the carrier supplying regions 101C may be connected together to surround, in plan view, the device region 102A. The carrier supplying region 101C may also be L-shaped in plan view. As illustrated in FIGS. 5A and 5B, a plurality of individually separated carrier supplying regions 101C may be provided. In FIGS. 5A and 5B, the individually separated carrier supplying regions 101C surround the device region 102A as a whole. Alternatively, the individually separated carrier supplying regions 101C may be disposed along only the source electrode 131 or the drain electrode 132.

The interface current blocking region 101B needs to prevent a current that vertically flows through the device region 102A and reaches the interface between the nitride semiconductor layer 102 and the semiconductor substrate 101 from horizontally flowing along this interface and reaching the side surface of the semiconductor substrate 101. Thus, the interface current blocking region 101B needs to surround the device region 102A. In consideration of expansion of a current in the nitride semiconductor layer 102, the interface current blocking region 101B preferably reaches the side surface of the semiconductor substrate 101. In addition, for formation of a vertical path, through which a current flows, in the semiconductor substrate 101, the normal region 101A, not the interface current blocking region 101B, is preferably disposed directly under the device region 102A. Note that a region directly under the device region 102A is within or coincides with a region that the device region 102A overlaps in plan view. Note that the interface current blocking region 101B may be disposed directly under a part of the device region 102A.

A boundary between the interface current blocking region 101B and the normal region 101A preferably does not have sharp corners to prevent electric fields from being localized. For example, as illustrated in FIG. 1A, the planar shape of the boundary is preferably a rounded rectangle or an ellipse. In addition, as illustrated in FIG. 1B, the cross sectional shape of the boundary is preferably a rounded shape or a shape without sharp corners such as a sector of an ellipse.

Moreover, the source electrode 131 and the interface current blocking region 101B are preferably electrically connected together. The interface current blocking region 101B that is not electrically connected with the source electrode 131 is electrically floating. In this case, variation in a drain voltage in switching a transistor significantly varies a potential of the interface current blocking region 101B, with the result that a breakdown voltage is unstable in switching the transistor. FIGS. 1C and 1D illustrate an example where the source electrode 131 and the interface current blocking region 101B are electrically connected together. The source electrode 131 and the interface current blocking region 101B that is exposed are electrically connected together by a through electrode 134.

Figure 6A:
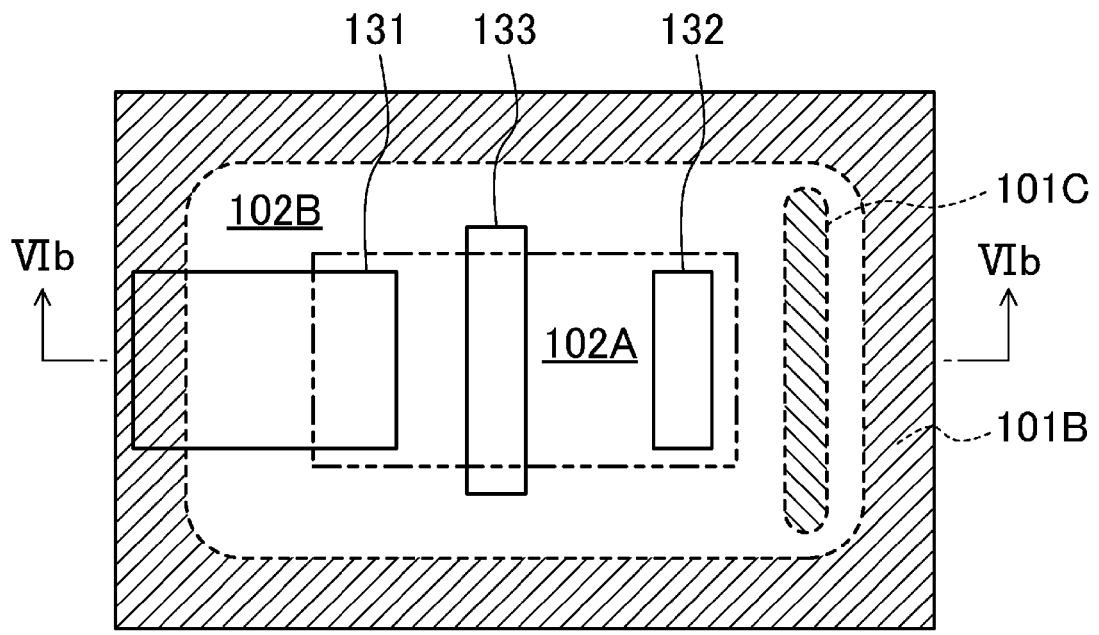
FIGS. 6A and 6B illustrate an alternative example of the semiconductor device of the one embodiment.
Figure 6B:
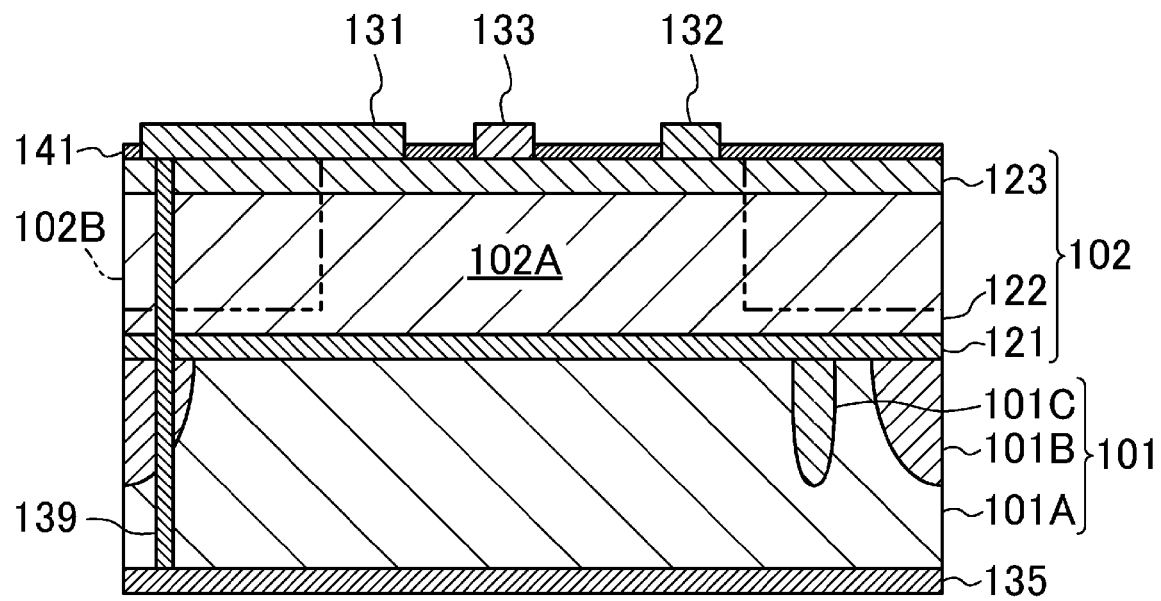
Figure 7A:
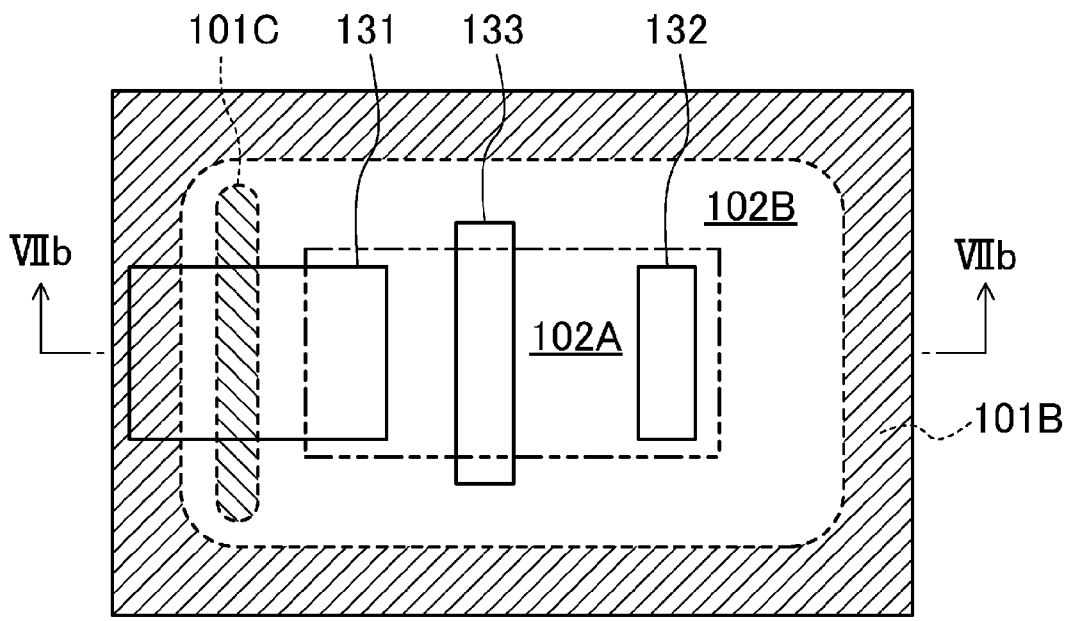
FIGS. 7A and 7B illustrate an alternative example of the semiconductor device of the one embodiment.
Figure 7B:
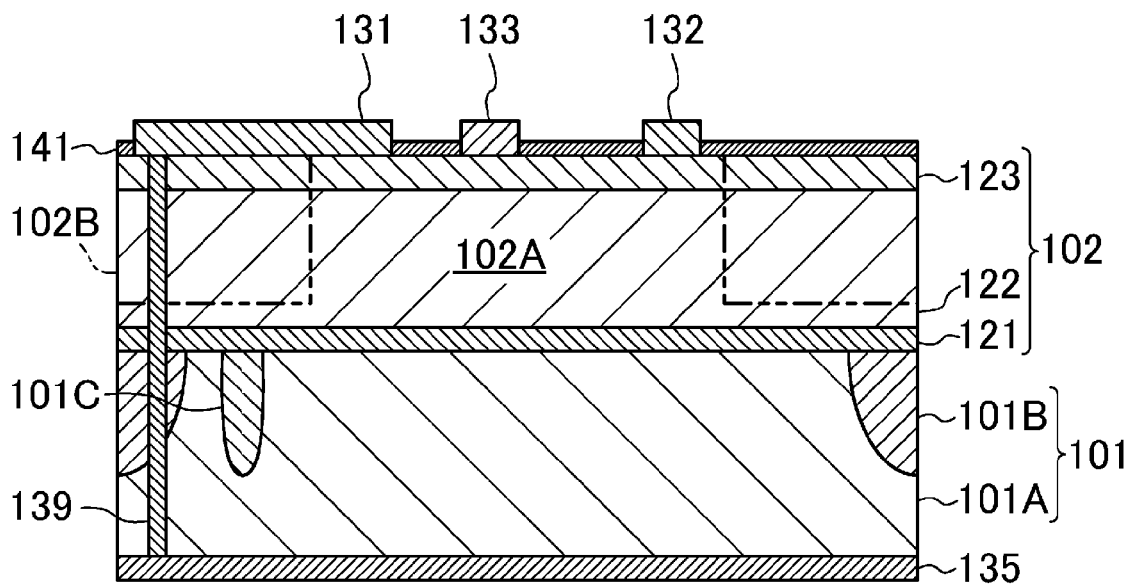
Figure 8A:
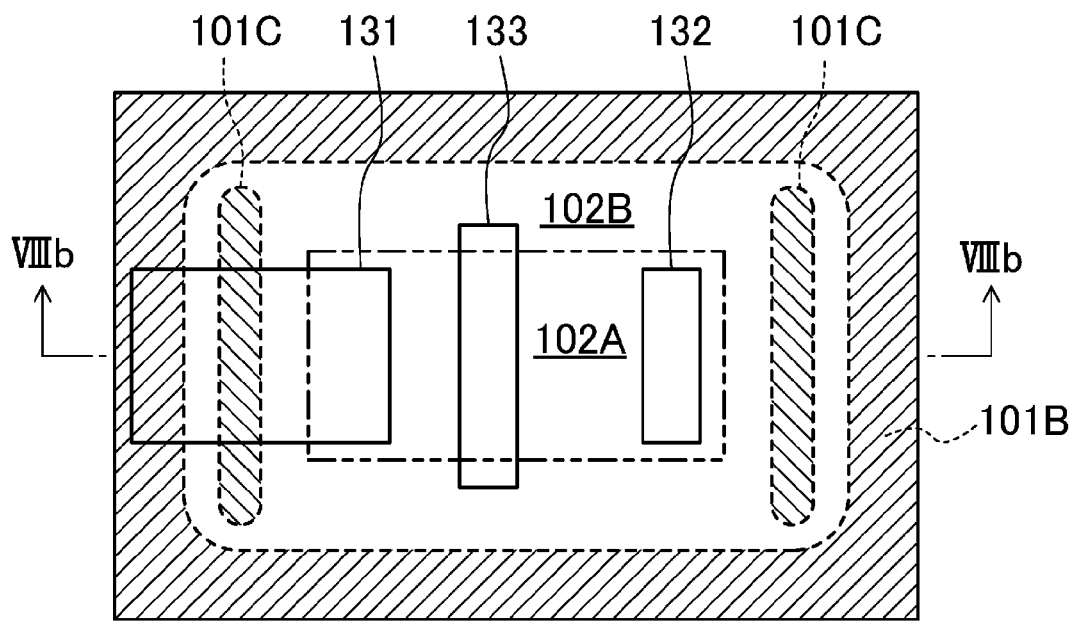
FIGS. 8A and 8B illustrate an alternative example of the semiconductor device of the one embodiment.
Figure 8B:
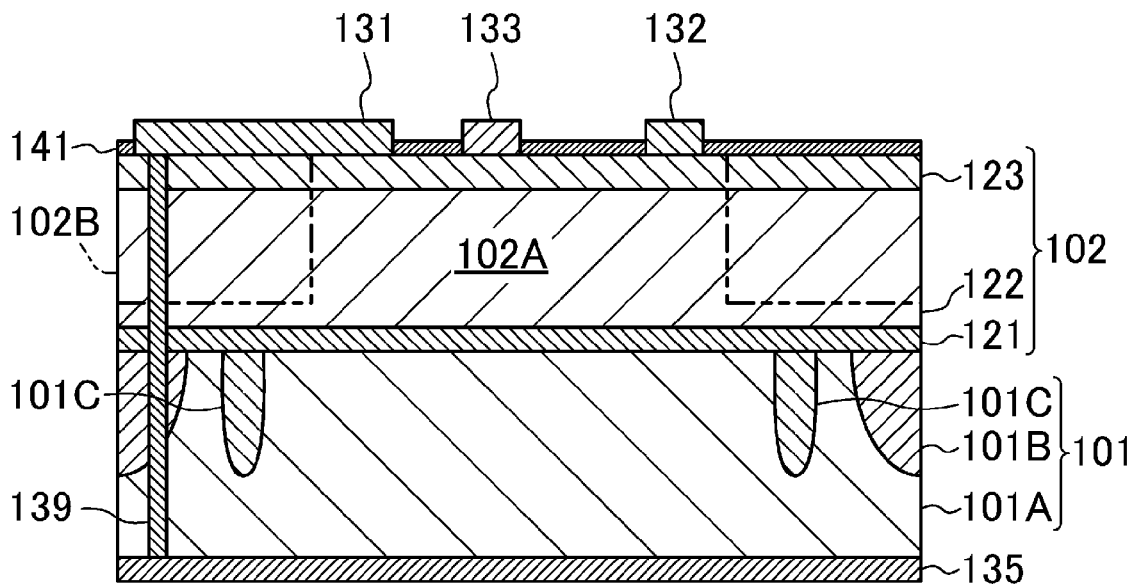
Figure 9A:
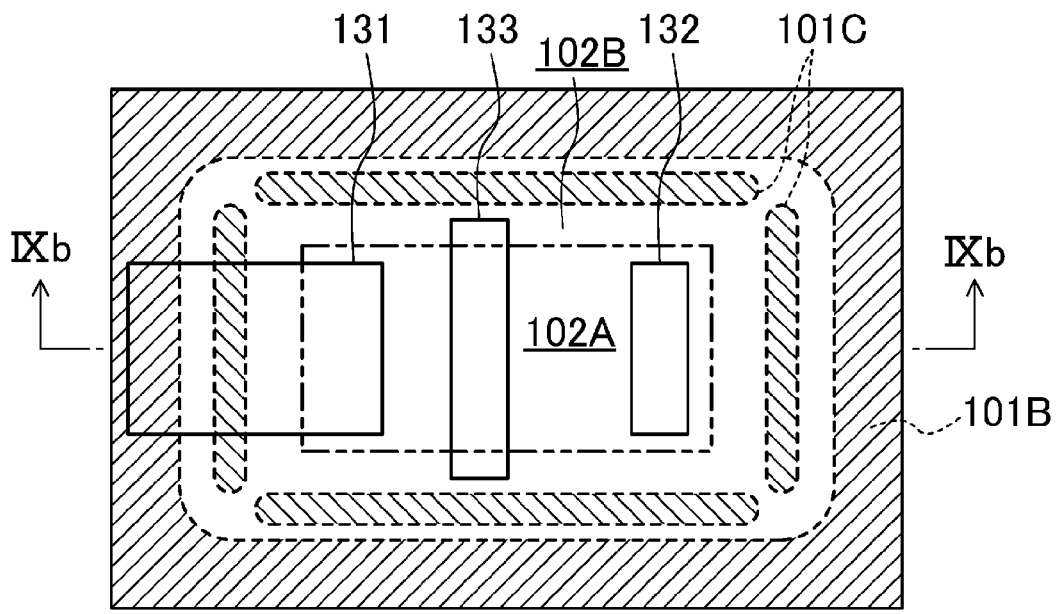
FIGS. 9A and 9B illustrate an alternative example of the semiconductor device of the one embodiment.
Figure 9B:
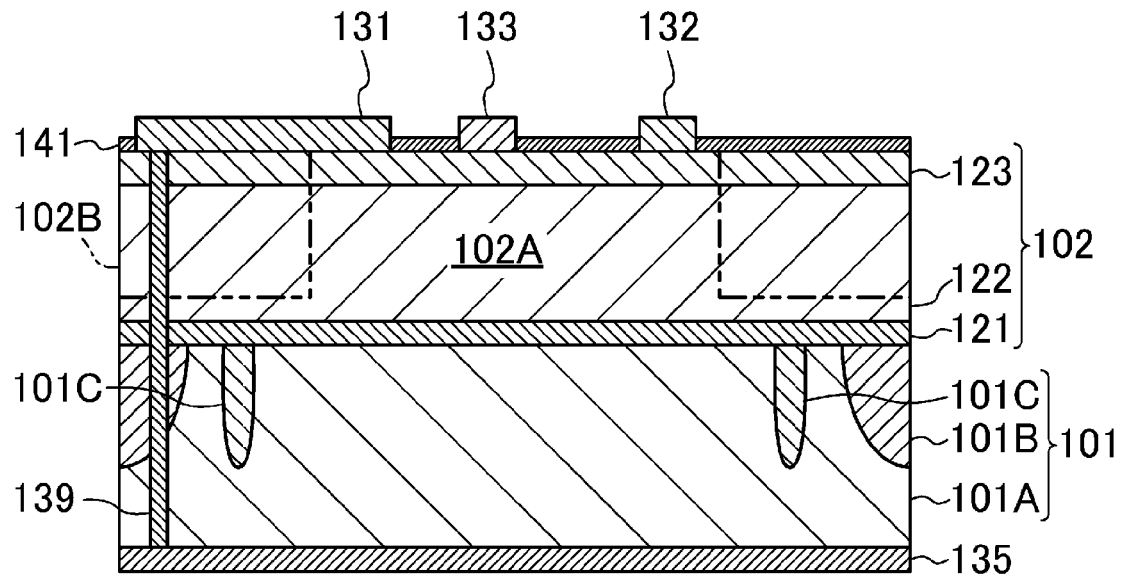
Figure 10A:
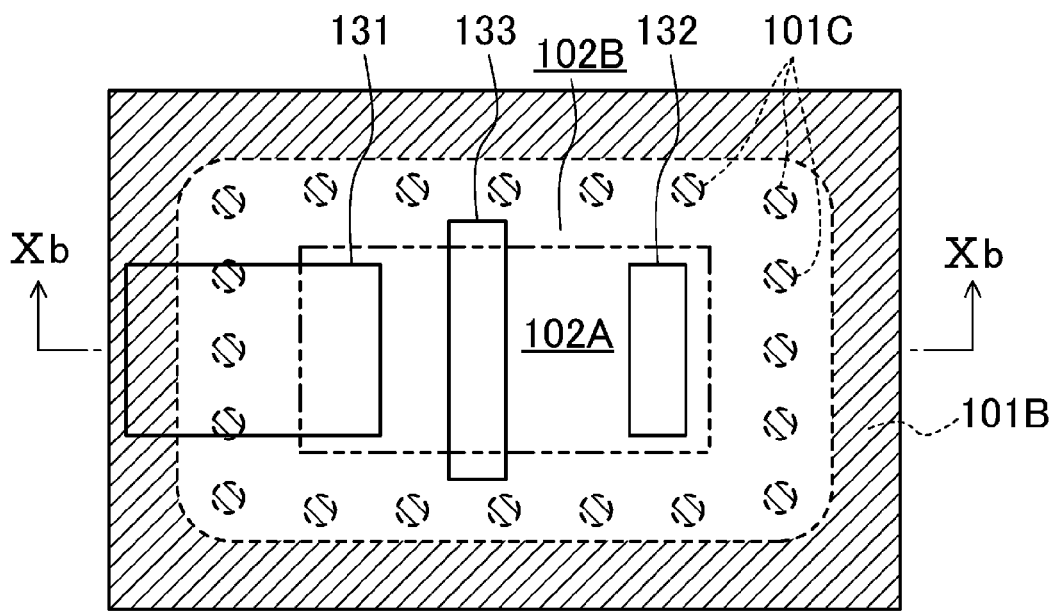
FIGS. 10A and 10B illustrate an alternative example of the semiconductor device of the one embodiment.
Figure 10B:
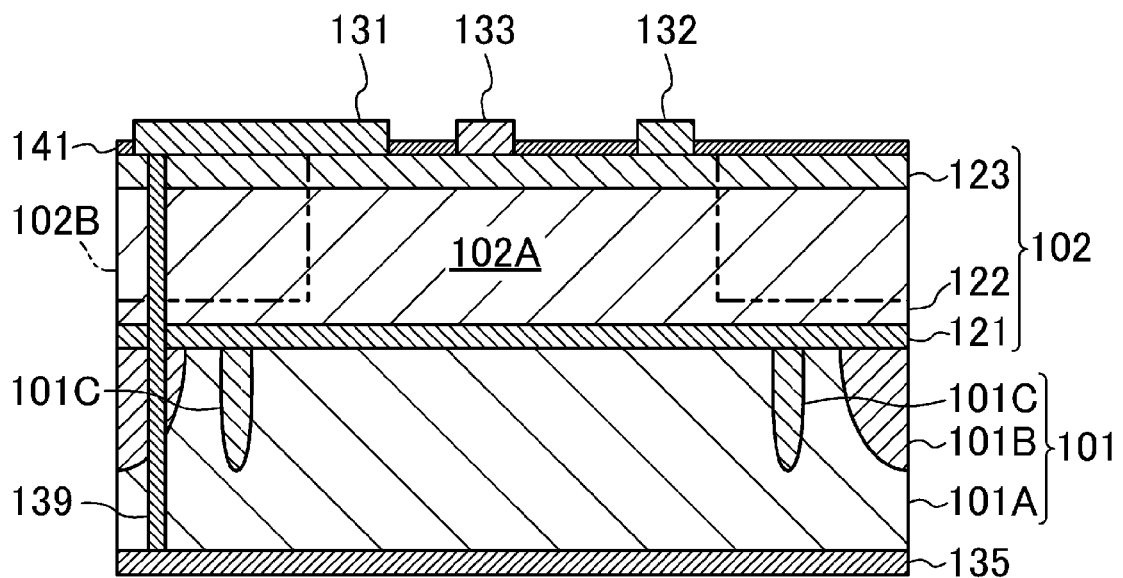

As illustrated in FIGS. 6A and 6B, a through electrode 139 that connects the source electrode 131 with the back electrode 135 may be provided. In this case, as illustrated in FIGS. 6A and 6B, the through electrode 139 is preferably surrounded by the interface current blocking region 101B in a top surface of the semiconductor substrate 101. If a current that has reached the interface between the nitride semiconductor layer 102 and the semiconductor substrate 101 horizontally flows along this interface and reaches the through electrode 139, this current might vertically flow through the through electrode 139. In addition, the current vertically flowing in the through electrode 139 might horizontally flow along the interface between the nitride semiconductor layer 102 and the semiconductor substrate 101. The configuration illustrated in FIGS. 6A and 6B can prevent the current horizontally flowing in the interface between the nitride semiconductor layer 102 and the semiconductor substrate 101 from reaching the through electrode 139. In addition, this configuration can prevent a current from horizontally flowing from the through electrode 139 to the interface between the nitride semiconductor layer 102 and the semiconductor substrate 101. Note that, as illustrated in FIGS. 7A-10B, the formation of the through electrode 139 does not depend on the layout of the carrier supplying region 101C.

In this embodiment, the description has been directed to the case of applying a positive voltage, with reference to the source electrode 131, to the drain electrode 132. Alternatively, for some semiconductor devices, a negative voltage may be applied, with reference to the source electrode 131, to the drain electrode 132 in a state in which a channel between the source electrode 131 and the drain electrode 132 is closed. In this case, an electric field is generated from the semiconductor substrate 101 to the drain electrode 132. Consequently, a hole accumulation region is formed at the interface between the buffer layer 121 and the semiconductor substrate 101. In this case, the carrier supplying region 101C needs to include p-type impurities so as to supply and emit holes serving as carriers. The interface current blocking region 101B needs to include n-type impurities to serve as a potential barrier to holes.

If the semiconductor substrate 101 is a p-type substrate, the carrier supplying region 101C needs to have a higher concentration of p-type impurities than the normal region 101A does. Specifically, the impurity concentration is preferably more than or equal to $1 \times 10^{16}$ cm$^{-3}$. The concentration of p-type impurities in the carrier supplying region 101C is preferably as high as possible. However, an excessively high concentration of p-type impurities causes difficulty in ion implantation etc., and affects the crystallinity etc. of the substrate. Thus, the concentration of the p-type impurities is preferably less than or equal to approximately $1 \times 10^{21}$ cm$^{-3}$. If the semiconductor substrate 101 is an n-type substrate, the carrier supplying region 101C also needs to include p-type impurities. The concentration of the p-type impurities in the carrier supplying region 101C needs to be higher than that of n-type impurities in the normal region 101A.

The interface current blocking region 101B may have any concentration of n-type impurities as long as the interface current blocking region 101B serves as a potential barrier to carriers generated between the nitride semiconductor layer 102 and the semiconductor substrate 101. For example, the concentration of n-type impurities may be approximately $1 \times 10^{16}$ cm$^{-3}$. Moreover, to serve as a potential barrier more efficiently, the interface current blocking region 101B preferably has the concentration of n-type impurities that is more than or equal to approximately $1 \times 10^{18}$ cm$^{-3}$, and more preferably more than or equal to approximately $1 \times 10^{19}$ cm$^{-3}$. The concentration of n-type impurities in the interface current blocking region 101B is preferably as high as possible. However, an excessively high concentration of n-type impurities affects the crystallinity etc. of the substrate. Thus, the concentration of n-type impurities is preferably less than or equal to approximately $1 \times 10^{21}$ cm$^{-3}$.

In addition, in the case of applying a negative voltage, with reference to the source electrode 131, to the drain electrode 132, the drain electrode 132 and the interface current blocking region 101B may be electrically connected together. The interface current blocking region 101B that is not electrically connected with the drain electrode 132 is electrically floating. In this case, variation in a drain voltage in switching the transistor significantly varies a potential of the interface current blocking region 101B, with the result that a breakdown voltage is unstable in switching the transistor.

In the case of applying a negative voltage, with reference to the source electrode 131, to the drain electrode 132, a through electrode that connects the drain electrode 132 with the back electrode 135 may be provided.

Figure 11A:
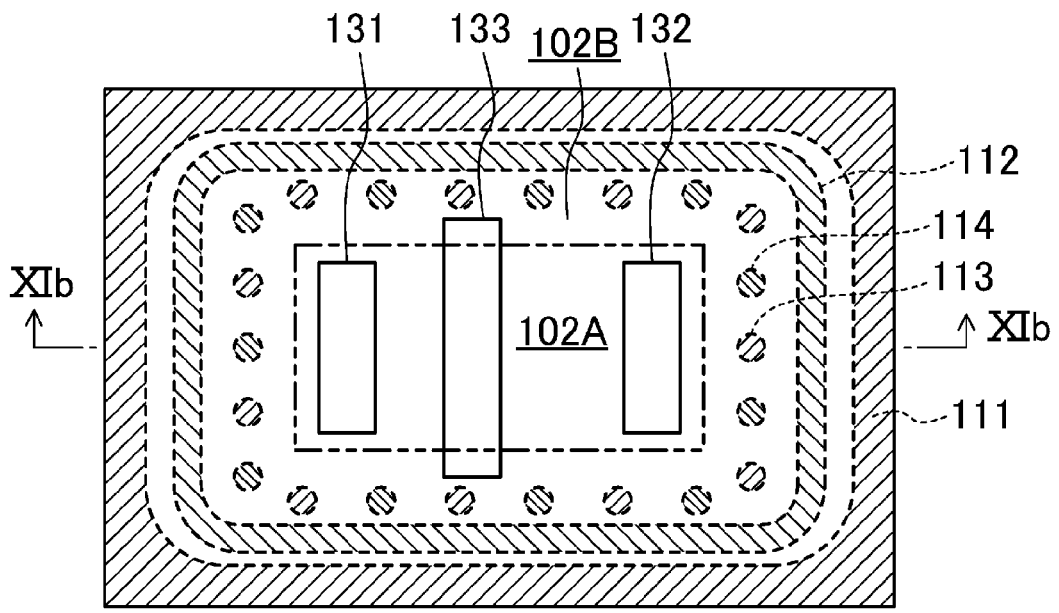
FIGS. 11A and 11B illustrate an alternative example of the semiconductor device of the one embodiment.
Figure 11B:
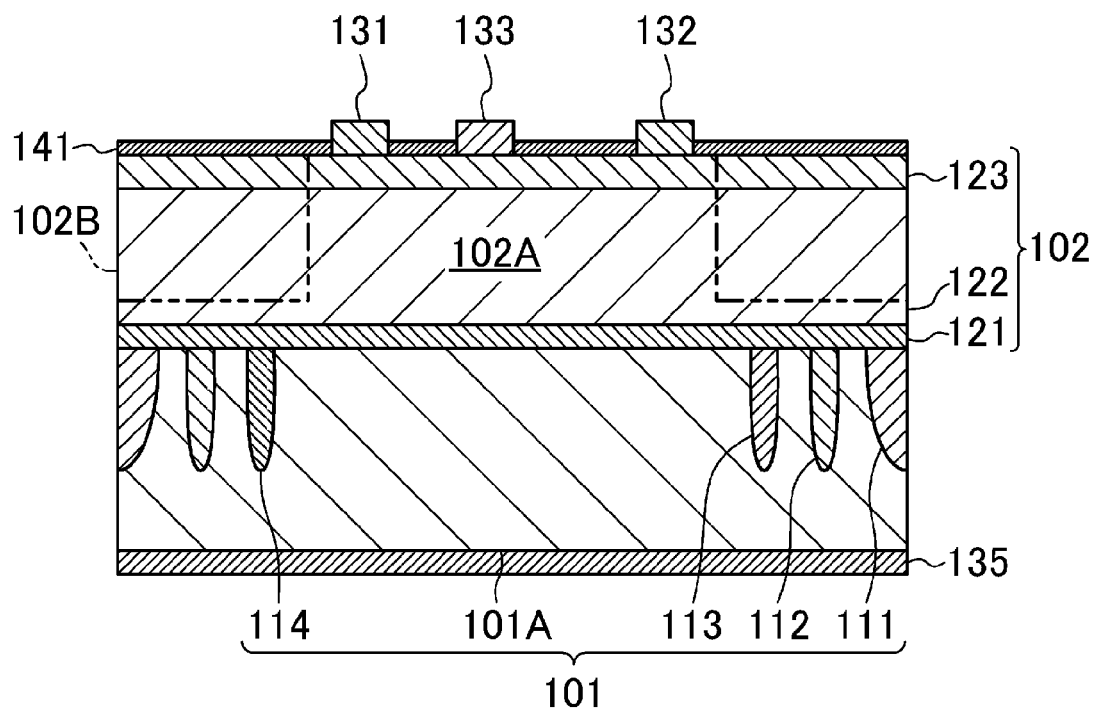

The operation for switching between the state where a positive voltage is applied to the drain electrode 132 and the state where a negative voltage is applied to the drain electrode 132 might be required. In this case, as illustrated in FIGS. 11A and 11B, first carrier suppliers 113 including n-type impurities and second carrier suppliers 114 including p-type impurities need to be provided. A carrier layer of electrons or a carrier layer of holes is formed at the interface between the semiconductor substrate 101 and the nitride semiconductor layer 102, and, in either case, the carrier layer can quickly appear and disappear.

In the interface current blocking region, a first interface current blocking portion 111 including n-type impurities and a second interface current blocking portion 112 including p-type impurities need to be provided. The first interface current blocking portion 111 serves as a potential barrier to holes. The second interface current blocking portion 112 serves as a potential barrier to electrons. Thus, both in a state in which a positive voltage is applied to the drain electrode 132, and in a state in which a negative voltage is applied to the drain electrode 132, generation of a current path between the buffer layer 121 and the semiconductor substrate 101 can be reduced.

Figure 12A:
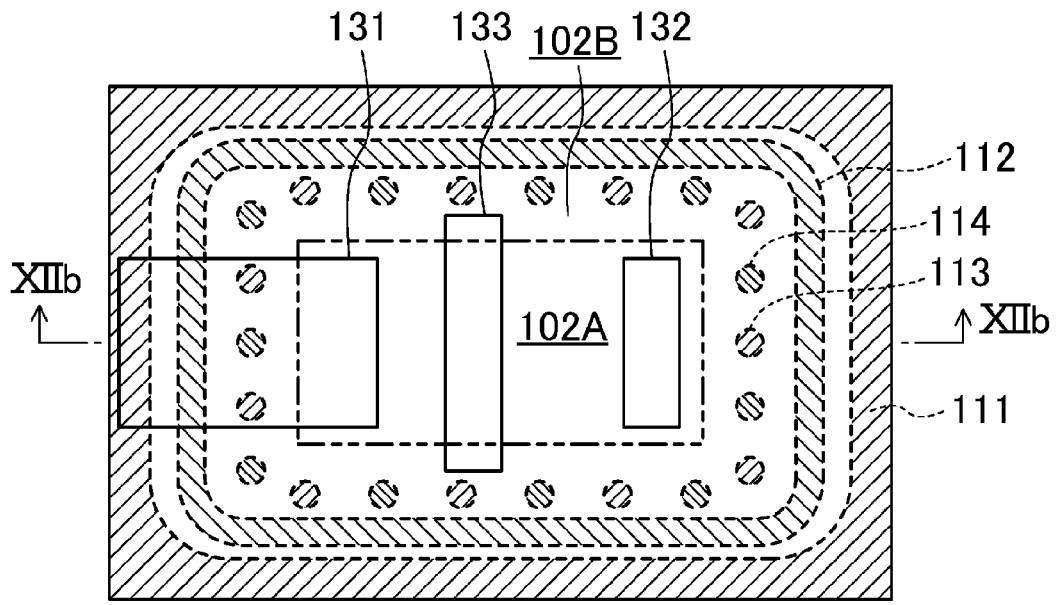
FIGS. 12A and 12B illustrate an alternative example of the semiconductor device of the one embodiment.
Figure 12B:
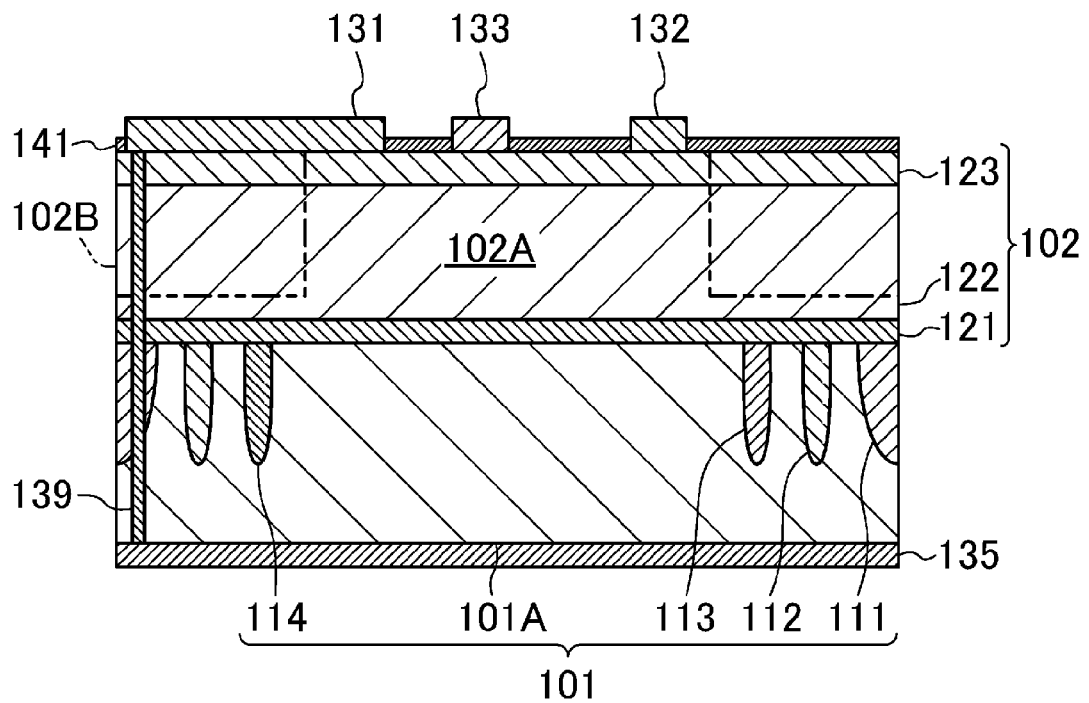

In this case, as illustrated in FIGS. 12A and 12B, the through electrode 139 may also be provided. In FIGS. 12A and 12B, in the top surface of the semiconductor substrate 101, the through electrode 139 is surrounded by the first interface current blocking portion 111 disposed outside the second interface current blocking portion 112. This configuration can also reduce a horizontal flow of current from the through electrode 139 to the interface between the nitride semiconductor layer 102 and the semiconductor substrate 101.

FIGS. 11A, 11B, 12A, and 12B illustrate the examples where the first interface current blocking portion 111 is disposed outside the second interface current blocking portion 112. Alternatively, the second interface current blocking portion 112 may be disposed outside the first interface current blocking portion 111. In addition, the first interface current blocking portion 111 and the second interface current blocking portion 112 are preferably separated from each other. The separation between the first interface current blocking portion 111 and the second interface current blocking portion 112 can reduce a flow of a tunnel current in the interface between the first interface current blocking portion 111 and the second interface current blocking portion 112.

FIGS. 11A, 11B, 12A, and 12B illustrate the examples where one first interface current blocking portion 111 and one second interface current blocking portion 112 are provided. Alternatively, the plurality of first interface current blocking portions 111 and the plurality of second interface current blocking portions 112 may be alternately arranged.

FIGS. 11A, 11B, 12A, and 12B illustrate the examples where the plurality of first carrier suppliers 113 and the plurality of second carrier suppliers 114 are provided. The numbers of first carrier suppliers 113 and second carrier suppliers 114 are not limited as long as both the first carrier supplier 113 and the second carrier supplier 114 are provided.

Figure 13A:
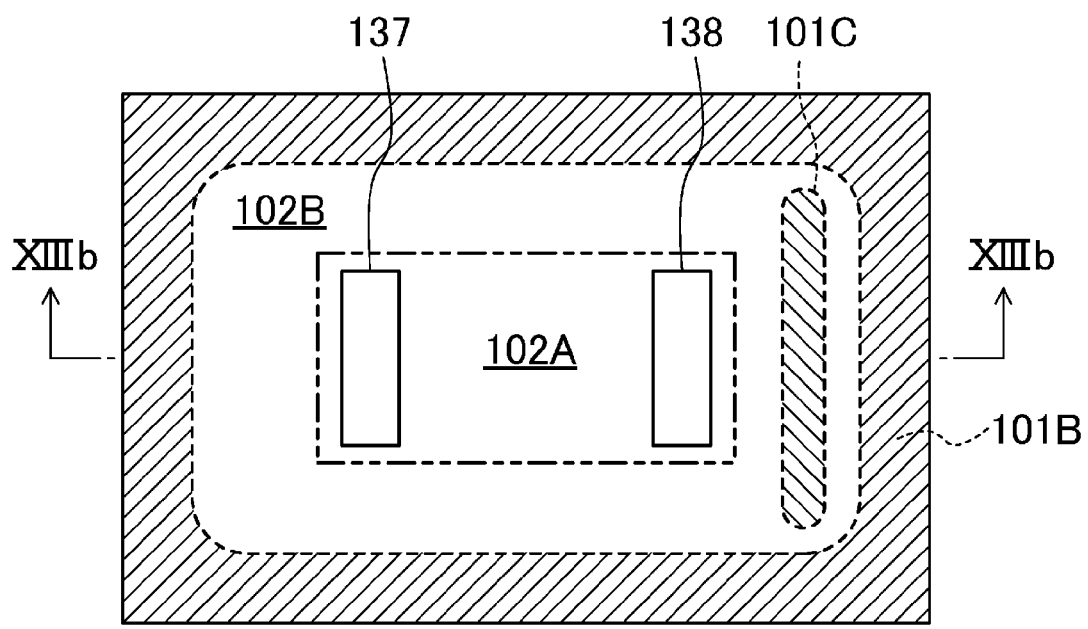
FIGS. 13A and 13B illustrate an alternative example of the semiconductor device of the one embodiment.
Figure 13B:
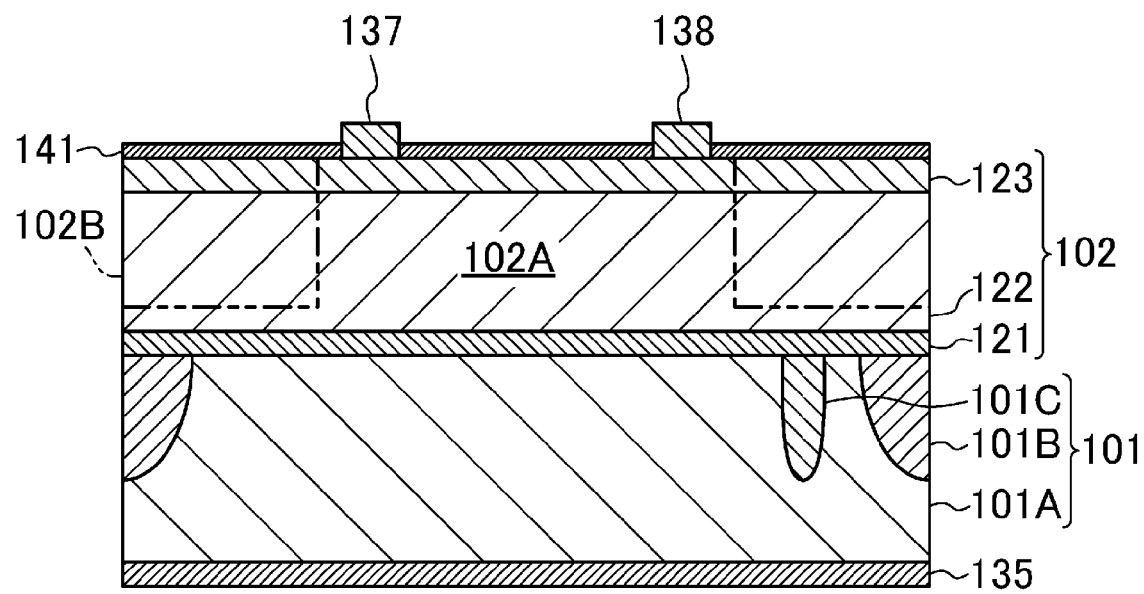

In all the examples, the semiconductor device disposed on the semiconductor substrate is not limited to a transistor such as an HFET. For example, the semiconductor device may be a diode. In this case, as illustrated in FIGS. 13A and 13B, an anode electrode 137 and a cathode electrode 138 need to be disposed on the device region 102A. Similarly to FIGS. 2A-5B, the carrier supplying region 101C may be disposed closer to the anode electrode 137, or surround the device region 102A. The conductivity type of the carrier supplying region 101C needs to be appropriately selected depending on a voltage applied to the diode. The conductivity type of the interface current blocking region 101B needs to be positive if the back electrode 135 is connected with the anode electrode 137, and negative if connected with the cathode electrode 138.

Figure 13C:
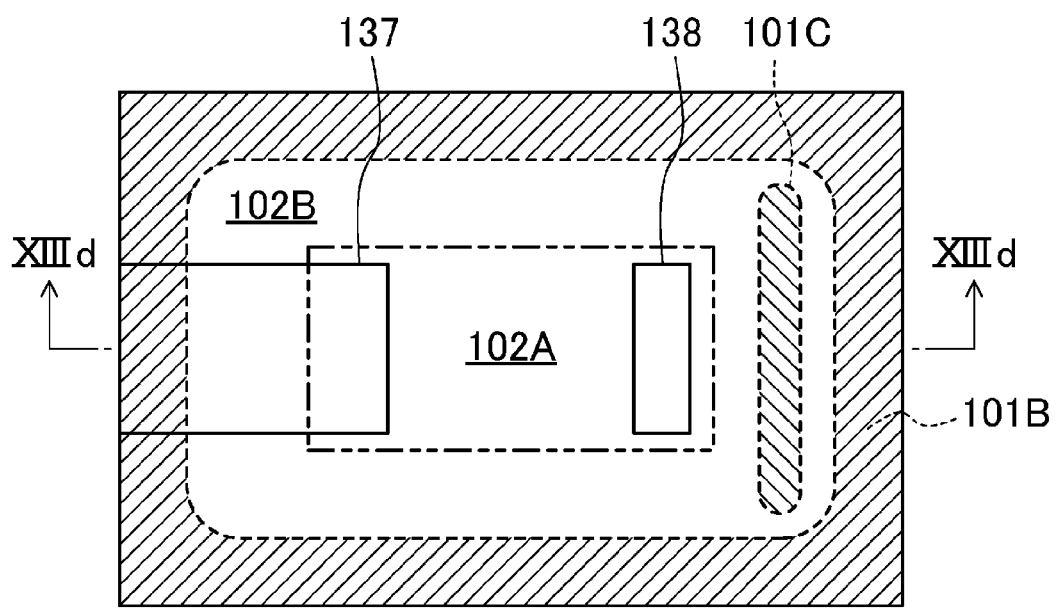
FIGS. 13C and 13D illustrate an alternative example of the semiconductor device of the one embodiment.
Figure 13D:
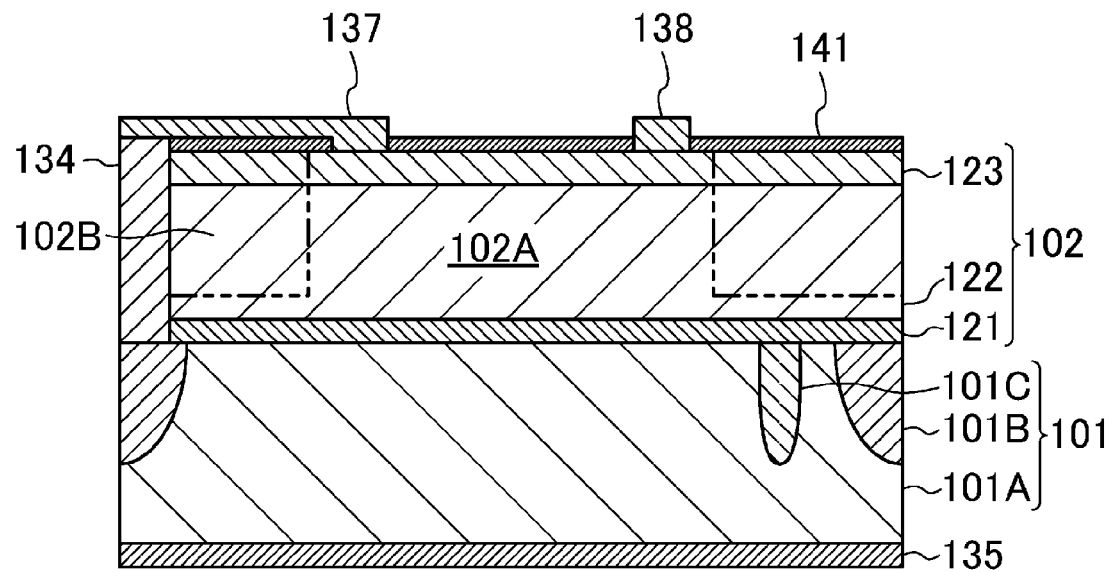
Figure 14A:
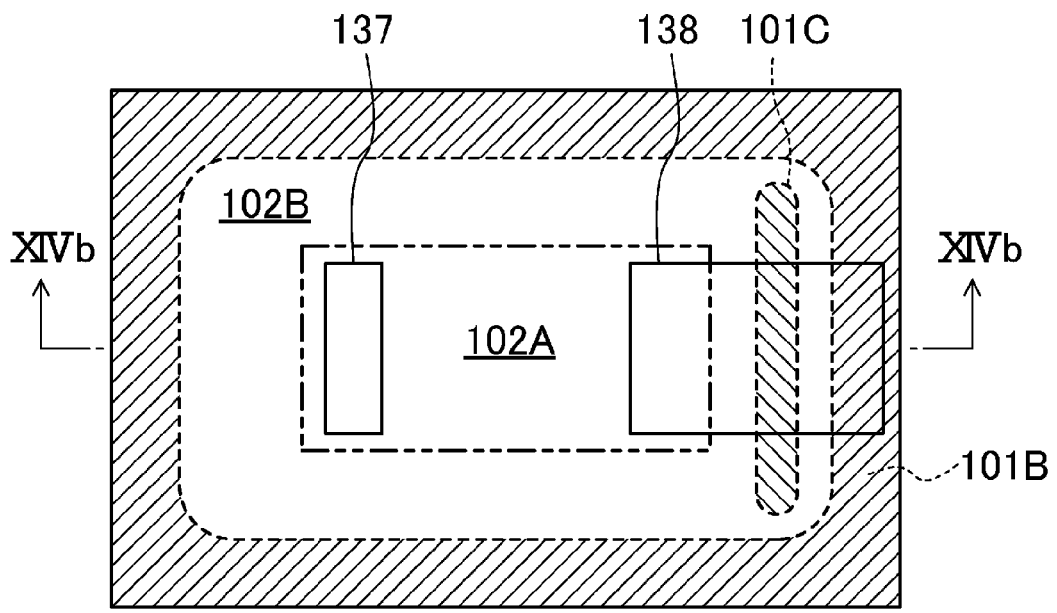
FIGS. 14A and 14B illustrate an alternative example of the semiconductor device of the one embodiment.
Figure 14B:
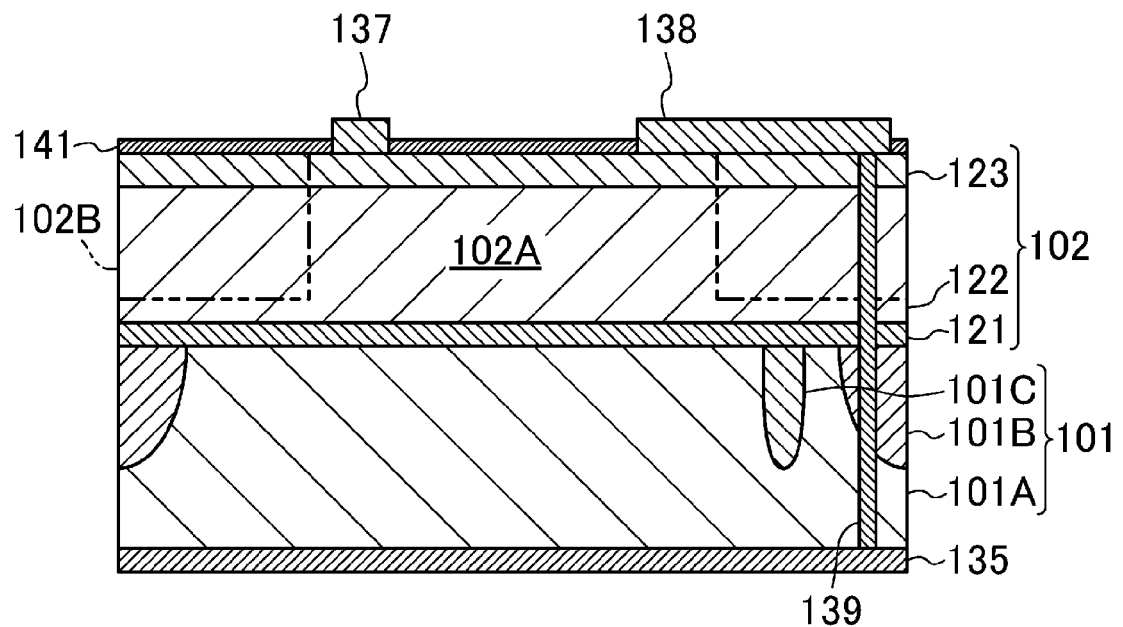

In addition, the interface current blocking region 101B and the anode electrode 137 may be electrically connected together. The interface current blocking region 101B and the cathode electrode 138 may be electrically connected together. FIGS. 13C and 13D illustrate an example where the anode electrode 137 and the interface current blocking region 101B are electrically connected together. The anode electrode 137 and the interface current blocking region 101B that are exposed are electrically connected together by the through electrode 134. As illustrated in FIGS. 14A and 14B, if the semiconductor device is a diode, the through electrode 139 can also be provided.

The examples of the transistor and diode on which the channel layer and the cap layer are disposed have been described. Alternatively, another type of transistor or diode may be applied. For example, a bipolar transistor, a PN junction diode, or a PIN junction diode may be applied.

Figure 15:
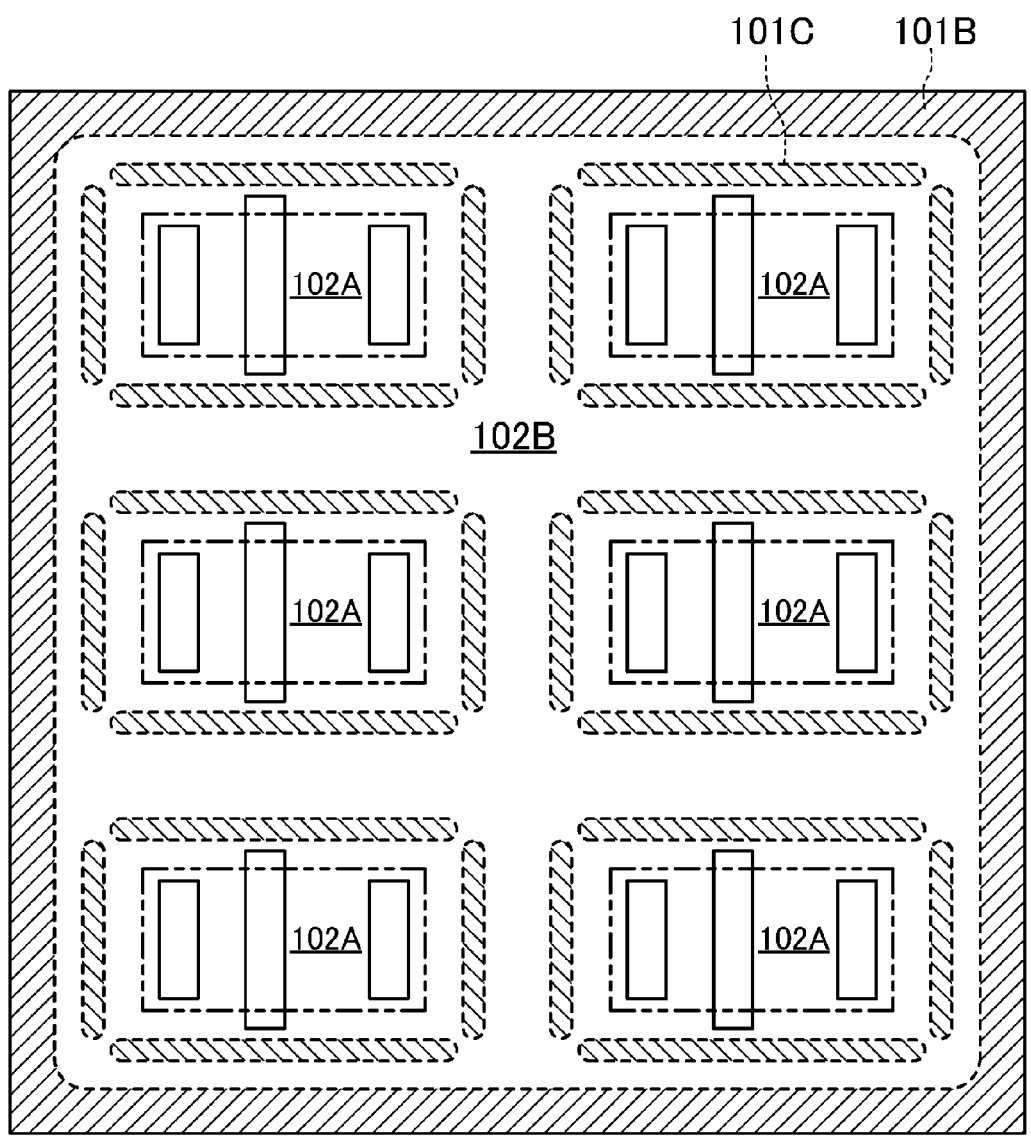
FIG. 15 is a plan view illustrating an example where a plurality of semiconductor devices are disposed on a semiconductor substrate.
Figure 16:
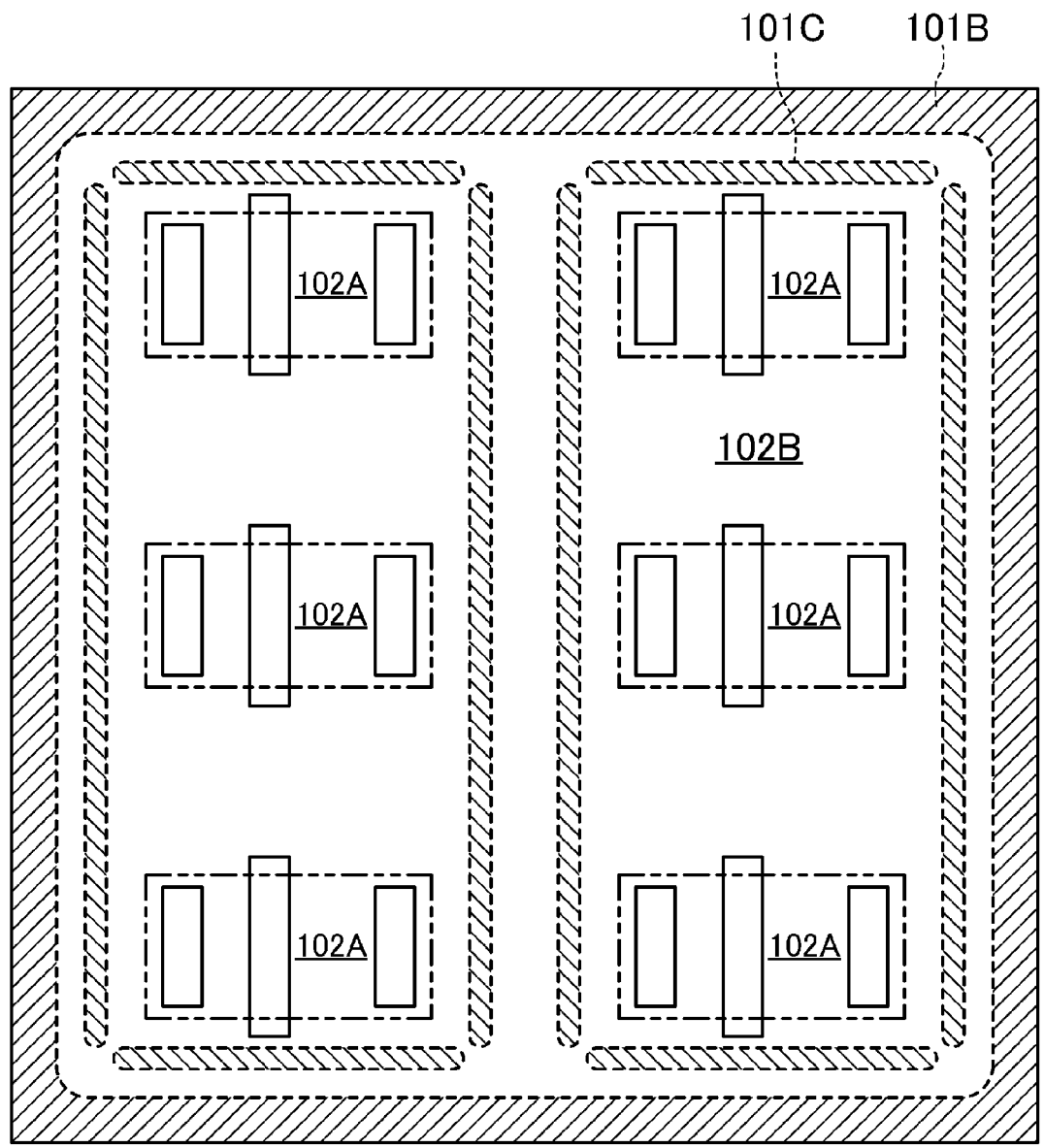
FIG. 16 is a plan view illustrating an example where a plurality of semiconductor devices are disposed on a semiconductor substrate.
Figure 17:
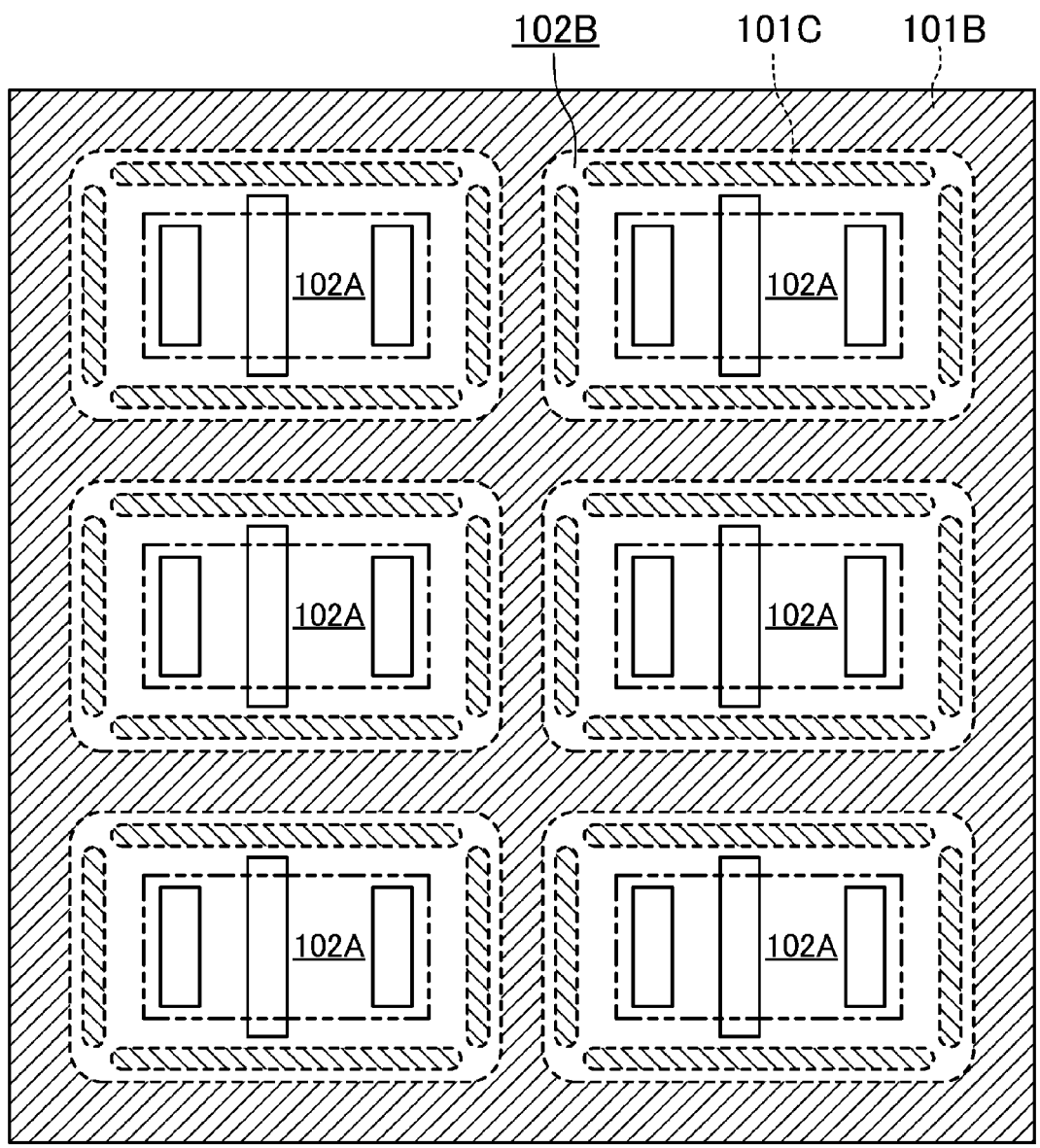
FIG. 17 is a plan view illustrating an example where a plurality of semiconductor devices are disposed on a semiconductor substrate.

FIGS. 1A-14B illustrate the examples where one semiconductor device is disposed on the semiconductor substrate. The plurality of semiconductor devices can also obtain similar advantages. In this case, as illustrated in FIGS. 15 and 16, the interface current blocking region 101B needs to be disposed on the periphery of the semiconductor substrate and surround the plurality of device regions 102A. In this case, the carrier supplying regions 101C may surround each of the device regions 102A as illustrated in FIG. 15, or may surround the plurality of device regions 102A as illustrated in FIG. 16. Alternatively, as illustrated in FIG. 17, the interface current blocking region 101B may surround each of the device regions 102A. In this case, the carrier supplying regions 101C may surround each of the device regions 102A. FIGS. 15-17 illustrate the examples where each of the interface current blocking regions and the carrier supplying regions has one conductivity type. Alternatively, each of the interface current blocking regions and the carrier supplying regions may include both a region including n-type impurities and a region including p-type impurities. If both the first interface current blocking portion and the second interface current blocking portion are provided, one of them may surround each of the device regions 102A, and the other may surround the plurality of device regions 102A as a group.

Note that the number of device regions 102A is not limited to a particular number. FIGS. 15-17 illustrate the examples where the transistor is disposed on each of the device regions 102A. Alternatively, another type of device such as a diode etc. may be disposed on one or more of the device regions 102A.

Even if the plurality of device regions 102A are provided, the shape of the carrier supplying region 101C is not limited to a particular one. Some or all of the carrier supplying regions may be integrated together. Alternatively, the plurality of individually separated carrier supplying regions may be provided.

As such, an integrated unit such as an inverter, a converter, etc. fabricated by forming a plurality of semiconductor devices on a semiconductor substrate including an interface current blocking region and a carrier supplying region has a significantly improved breakdown voltage, and enables excellent switching operation and high-frequency operation.

In all the examples described above, the semiconductor substrate is a Si substrate. Instead of a Si substrate, a silicon carbide (SiC) substrate, a gallium arsenide (GaAs) substrate, a gallium nitride (GaN) substrate, a zinc oxide (ZnO) substrate, etc. may be used. The semiconductor substrate that is a p-type substrate has been described. Alternatively, the semiconductor substrate may be an n-type substrate. The semiconductor substrate that is a Si substrate may have p-type impurities such as boron (B), or n-type impurities such as phosphorus (P).

In all the examples described above, the device isolation region does not reach the buffer layer. Alternatively, the device isolation region may reach the buffer layer. Moreover, the device isolation region may reach the semiconductor substrate. The device isolation region only have to be formed by implanting impurities such as argon (Ar) etc. that does not contribute to the conductivity type.

The semiconductor device, of the present disclosure, using a nitride semiconductor disposed on a semiconductor substrate can improve the vertical breakdown voltage, the switching characteristics, and the high-frequency characteristics, and is useful as a nitride semiconductor device that is applicable as a power transistor etc. particularly used for a power supply circuit.

What is claimed is:

1. A nitride semiconductor device comprising:
   a semiconductor substrate; and
   a nitride semiconductor layer disposed on the semiconductor substrate, wherein
   the semiconductor substrate includes a normal region, a carrier supplying region, and an interface current blocking region,
   the nitride semiconductor layer includes a device region and a device isolation region surrounding the device region,
   the interface current blocking region surrounds the normal region and the carrier supplying region,
   the interface current blocking region and the carrier supplying region include impurities,
   at least a part of the device region is disposed above the normal region,
   the carrier supplying region has a conductivity type allowing the carrier supplying region to serve as a source of carriers supplied to or a destination of carriers supplied from a carrier layer generated at an interface between the nitride semiconductor layer and the semiconductor substrate depending on an electric field applied therebetween, and
   the interface current blocking region has a conductivity type allowing the interface current blocking region to serve as a potential barrier to the carriers.

2. The nitride semiconductor device of claim 1, wherein
   the carrier supplying region has a same conductivity type as the normal region does, and
   the carrier supplying region has a higher impurity concentration than the normal region does.

3. The nitride semiconductor device of claim 1, wherein the carrier supplying region and the normal region have different conductivity types.

4. The nitride semiconductor device of claim 1, wherein
   the carrier supplying region includes a first carrier supplier having a same conductivity type as the normal region does, and a second carrier supplier having a conductivity type different from a conductivity type of the normal region, and
   the first carrier supplier has a higher impurity concentration than the normal region does.

5. The nitride semiconductor device of claim 4, wherein the first carrier supplier and the second carrier supplier are separated from each other.

6. The nitride semiconductor device of claim 1, wherein the carrier supplying region has an impurity concentration that is at least $1 \times 10^{16}$ cm$^{-3}$.

7. The nitride semiconductor device of claim 1, wherein the carrier supplying region is disposed in a portion, of the semiconductor substrate, other than a portion directly under the device region.

8. The nitride semiconductor device of claim 1, wherein
the interface current blocking region has a same conductivity type as the normal region does, and
the interface current blocking region has a higher impurity concentration than the normal region does.

9. The nitride semiconductor device of claim 1, wherein the interface current blocking region and the normal region have different conductivity types.

10. The nitride semiconductor device of claim 1, wherein
the interface current blocking region includes a first interface current blocking portion having a same conductivity type as the normal region does, and a second interface current blocking portion having a conductivity type different from a conductivity type of the normal region, and
the first interface current blocking portion has a higher impurity concentration than the normal region does.

11. The nitride semiconductor device of claim 10, wherein the first interface current blocking portion and the second interface current blocking portion are separated from each other.

12. The nitride semiconductor device of claim 1, wherein the interface current blocking region has an impurity concentration that is at least $1 \times 10^{16}$ cm$^{-3}$.

13. The nitride semiconductor device of claim 1, wherein the interface current blocking region is disposed in a portion, of the semiconductor substrate, other than a portion directly under the device region.

14. The nitride semiconductor device of claim 1, wherein the nitride semiconductor layer includes a first layer and a second layer disposed on the first layer and having a wider band gap than the first layer does.

15. The nitride semiconductor device of claim 1, further comprising:
a source electrode, a drain electrode, and a gate electrode that are disposed on the nitride semiconductor layer.

16. The nitride semiconductor device of claim 1, further comprising:
a cathode electrode and an anode electrode that are disposed on the nitride semiconductor layer.

17. The nitride semiconductor device of claim 1, further comprising:
a back electrode disposed on a surface, of the semiconductor substrate, opposite to a surface on which the nitride semiconductor layer is disposed; and
a through electrode penetrating the nitride semiconductor layer and the semiconductor substrate, and connected with the back electrode.

18. The nitride semiconductor device of claim 17, wherein the through electrode is surrounded by the interface current blocking region in a top surface of the semiconductor substrate.

19. The nitride semiconductor device of claim 17, wherein the through electrode penetrates the interface current blocking region.

20. The nitride semiconductor device of claim 1, wherein the device region is misaligned with the carrier supplying region in plan view.

* * * * *